US009437606B2

United States Patent
Makala et al.

(10) Patent No.: US 9,437,606 B2
(45) Date of Patent: Sep. 6, 2016

(54) METHOD OF MAKING A THREE-DIMENSIONAL MEMORY ARRAY WITH ETCH STOP

(71) Applicant: SanDisk Technologies, Inc., Plano, TX (US)

(72) Inventors: Raghuveer S. Makala, Sunnyvale, CA (US); Johann Alsmeier, San Jose, CA (US); Yao-Sheng Lee, Tampa, FL (US); Masanori Terahara, Yokkaichi (JP); Hirofumi Watatani, Yokkaichi (JP); Jayavel Pachamuthu, Yokkaichi, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 430 days.

(21) Appl. No.: 13/933,236

(22) Filed: Jul. 2, 2013

(65) Prior Publication Data

US 2015/0008503 A1    Jan. 8, 2015

(51) Int. Cl.
*H01L 29/792* (2006.01)
*H01L 27/115* (2006.01)
(Continued)

(52) U.S. Cl.
CPC ..... *H01L 27/11582* (2013.01); *H01L 21/8221* (2013.01); *H01L 27/0688* (2013.01); *H01L 27/1157* (2013.01)

(58) Field of Classification Search
CPC H01L 29/788; H01L 21/336; H01L 27/0688
USPC .............................. 365/185.18; 257/317, 324
See application file for complete search history.

(56) References Cited

U.S. PATENT DOCUMENTS 5,985,753 A    11/1999 Yu et al.
6,046,085 A *   4/2000 Chan ................. H01L 27/11521
                                                            216/67

(Continued)

FOREIGN PATENT DOCUMENTS

KR    10-2009-0001377 A    1/2009
WO    WO02/15277 A2         2/2002

OTHER PUBLICATIONS

International Search Report and Written Opinion received in connection with international application No. PCT/US2014/044833; mailed Oct. 2, 2014.

(Continued)

*Primary Examiner* — Matthew Landau
*Assistant Examiner* — Eric Ashbahian
(74) *Attorney, Agent, or Firm* — The Marbury Law Group PLLC

(57) ABSTRACT

A method of making a semiconductor device including forming a sacrificial feature over a substrate, forming a plurality of etch through regions having an etch through material and an etch stop region having an etch stop material over the sacrificial feature, forming a stack of alternating layers of a first material and a second material over the plurality of the etch through regions and the plurality of the etch stop regions, etching the stack to form a plurality of openings through the stack and through the etch through regions to expose the sacrificial feature, such that the etch through material is etched preferentially compared to the first and the second materials of the stack, removing the sacrificial feature through the plurality of openings and etching the stack to form a slit trench up to or only partially through the etch stop region, such that the first and the second materials of the stack are etched preferentially compared to the etch stop material.

16 Claims, 20 Drawing Sheets

(51) Int. Cl.
*H01L 21/822* (2006.01)
*H01L 27/06* (2006.01)

(56) References Cited

U.S. PATENT DOCUMENTS

| | | | |
|---|---|---|---|
| 6,953,697 | B1 | 10/2005 | Castle et al. |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,445,347 | B2 | 5/2013 | Alsmeier |
| 2002/0168849 | A1 | 11/2002 | Lee et al. |
| 2006/0068592 | A1 | 3/2006 | Dostalik |
| 2007/0210338 | A1 | 9/2007 | Orlowski |
| 2007/0252201 | A1 | 11/2007 | Kito et al. |
| 2008/0258308 | A1 | 10/2008 | Liu et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0291177 | A1 | 12/2011 | Lee et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0034785 | A1 | 2/2012 | Hayashi et al. |
| 2012/0146127 | A1 | 6/2012 | Lee et al. |
| 2012/0256247 | A1 | 10/2012 | Alsmeier |
| 2013/0069139 | A1* | 3/2013 | Ishihara ............ H01L 29/66833 257/324 |
| 2013/0069140 | A1 | 3/2013 | Ichinose et al. |
| 2013/0100741 | A1* | 4/2013 | Choi ................ H01L 27/11565 365/185.18 |
| 2013/0161818 | A1* | 6/2013 | Han .................... H01L 27/0688 257/751 |
| 2013/0292757 | A1* | 11/2013 | Aritome ............ H01L 27/11556 257/316 |
| 2014/0080276 | A1* | 3/2014 | Brand ............... H01L 29/66803 438/283 |
| 2014/0154889 | A1* | 6/2014 | Wang ................. H01L 21/32136 438/720 |
| 2014/0264533 | A1 | 9/2014 | Simsek-Ege et al. |
| 2014/0264542 | A1 | 9/2014 | Simsek-Ege et al. |
| 2014/0273462 | A1* | 9/2014 | Simsek-Ege ...... H01L 27/11578 438/696 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Geil et al., "Etch Resistance of Focused-Ion-Beam-Implanted $SiO_2$," LEOS 1991: Summer Topical Meetings on Epitaxial Materials and In-situ Processing for Optoelectronic Devices, Jul. 29-31, 1991 and Microfabrication for Photonics and Optoelectronics, Jul. 31-Aug. 2, 1991.
U.S. Appl. No. 13/443,287, Johann Alsmeier et al., "Vertical NAND Device with Low Capacitance and Silicided Word Lines," filed Apr. 10, 2012, Specification and drawings.
U.S. Appl. No. 13/478,483, Yao-Sheng Lee et al., Multi-Level Contact to a 3D Memory Array and Method of Making, filed May 23, 2012, Specification and drawings.
U.S. Appl. No. 13/544,328, Raghuveer Makala et al., "Three Dimensional NAND Device and Method of Charge Trap Layer Separation and Floating Gate Formation in the NAND Device," filed Jul. 9, 2012, Specification and drawings.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
U.S. Appl. No. 13/754,293, filed Jan. 30, 2013, "Compact Three Dimensional Vertical NAND and Method of Making Thereof," Johann Alsmeier et al., Specification and drawings.
U.S. Appl. No. 13/586,413, filed Aug. 15, 2012, "Method of Making a Three-Dimensional Memory Array with Etch Stop," Yao-Sheng Lee et al., Specification and drawings.
Qian et al., "Fabrication of Si Microstructures Using Focused Ion Beam Implantation and Reactive Ion Etching," 2008 J. Micromech. Microeng. 18, 035003, 5pgs.
Sievila et al., "The Fabrication of Silicon Nanostructures by Focused-Ion-Beam Implantation and TMAH Wet Etching," 2010 Nanotechnology, 21, 145301, 6pgs.
Chekurov et al., "The Fabrication of Silicon Nanostructures by Local Gallium Implantation and Cryogenic Deep Reactive Ion Etching," 2009 Nanotechnology, 20, 065307, 5pgs.

* cited by examiner

METHOD OF MAKING A THREE-DIMENSIONAL MEMORY ARRAY WITH ETCH STOP

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a semiconductor device including forming a sacrificial feature over a substrate, forming a plurality of etch through regions having an etch through material and an etch stop region having an etch stop material over the sacrificial feature, forming a stack of alternating layers of a first material and a second material over the plurality of the etch through regions and the plurality of the etch stop regions, etching the stack to form a plurality of openings through the stack and through the etch through regions to expose the sacrificial feature, such that the etch through material is etched preferentially compared to the first and the second materials of the stack, removing the sacrificial feature through the plurality of openings and etching the stack to form a slit trench up to or only partially through the etch stop region, such that the first and the second materials of the stack are etched preferentially compared to the etch stop material.

Another embodiment relates to a monolithic, three dimensional vertical NAND string including a substrate, a semiconductor channel, at least one end portion of the semiconductor channel extending substantially perpendicular to a major surface of the substrate, at least one charge storage region located adjacent to semiconductor channel and a plurality of control gate electrodes having a strip shape extending substantially parallel to the major surface of the substrate. The plurality of control gate electrodes include at least a first control gate electrode located in a first device level and a second control gate electrode located in a second device level located over the major surface of the substrate and below the first device level. The NAND string also includes an etch stop region located between the substrate and the plurality of control gate electrodes. The semiconductor channel has a U-shaped side cross section, including two wing portions which extend substantially perpendicular to the major surface of the substrate above the etch stop region, and a connecting portion which connects the two wing portions, and which extends substantially parallel to the major surface of the substrate below the etch stop region and a lower part of each wing portion is wider than an upper part of each wing portion.

Another embodiment relates to a monolithic, three dimensional vertical NAND string including a substrate, a semiconductor channel, at least one end portion of the semiconductor channel extending substantially perpendicular to a major surface of the substrate, at least one charge storage region located adjacent to semiconductor channel and a plurality of control gate electrodes having a strip shape extending substantially parallel to the major surface of the substrate. The plurality of control gate electrodes comprise at least a first control gate electrode located in a first device level and a second control gate electrode located in a second device level located over the major surface of the substrate and below the first device level; and an etch stop region and a plurality of etch through material regions located between the substrate and the plurality of control gate electrodes. The semiconductor channel has a U-shaped side cross section, comprising two wing portions which extend substantially perpendicular to the major surface of the substrate through the plurality of etch through material regions, and a connecting portion which connects the two wing portions, and which extends substantially parallel to the major surface of the substrate below the etch stop region and a lower part of each wing portion located between the substrate and the plurality of control gate electrodes is surrounded by a respective one of the plurality of the etch through material regions.

DETAILED DESCRIPTION

Figure 1A:
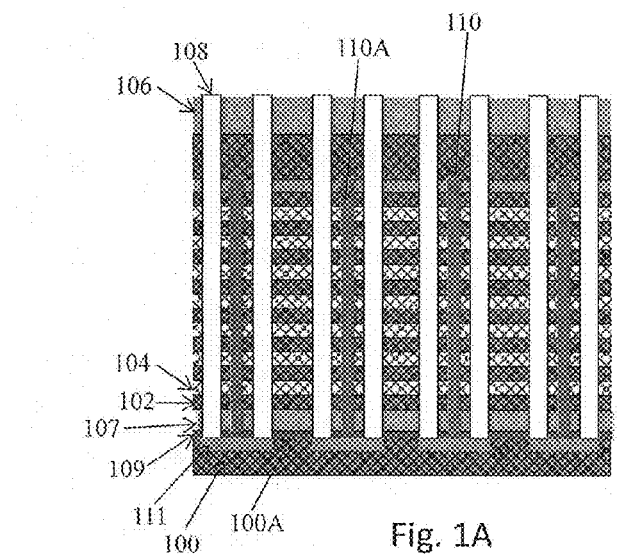
FIG. 1A is a schematic side cross sectional view illustrating a step in a method of making a three dimensional memory device.

Embodiments include monolithic three dimensional NAND strings and methods of making three dimensional NAND strings. In an embodiment, the NAND string may have a U-shape (also known as a "pipe" shape) with two vertical channel wing portions connected with a horizontal channel connecting the wing portions. In one aspect, the U-shaped or pipe shaped channel may be solid. In another aspect, the U-shaped or pipe shaped channel may be hollow cylinder shaped. The U-shaped pipe channel may be filled or unfilled. In an embodiment, each wing of the semiconductor channel has a circular cross section when viewed from above. Separate front side and back side methods for fabricating both single vertical channel and U-shaped channel NAND strings are taught in co-pending U.S. patent application Ser. No. 12/827,947, hereby incorporated by reference in its entirety for teaching of the separate front and back side processing methods. Combination front side and back side methods for fabricating both single vertical channel and U-shaped channel NAND strings are taught in co-pending U.S. patent application Ser. No. 13/083,775, hereby incorporated by reference in its entirety for teaching combination front side and back side processing methods.

As used herein, the term "control gate" and "word line" refer to the same electrically conductive entity. A control gate may be considered a portion of a word line located adjacent to and controlling one NAND cell in an array of NAND cells. A word line controls plural NAND cells in the array. Thus, the word line may be considered to be a portion of the electrically conductive entity which connects the control gates. However, it should be understood that the word line and its control gate portions may be formed during the same step and may comprise the same one or more electrically conductive layers as will be described below.

FIGS. 1A-1F illustrate a method of making a three dimensional memory device (e.g., vertical NAND string) according to an embodiment disclosed in copending application U.S. patent application Ser. No. 13/586,413, hereby incorporated by reference in its entirety. In this embodiment, a substrate 100 is provided with a stack of alternating layers of a first material layer 102 and a second material layer 104 formed over the major surface 100a of the substrate 100.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, electrically conductive layers (e.g., electrodes and/or interconnects) over such substrates, or any other semiconducting or non-semiconducting material, such as silicon oxide, glass, plastic, metal or ceramic substrate. The substrate 100 may include integrated circuits fabricated thereon, such as driver circuits for a memory device.

Layers 102 and 104 may be deposited over the substrate 100 by any suitable deposition method, such as sputtering, CVD, PECVD, MBE, etc. Preferably, the first material layer 102 is suitable for use as a control gate. Suitable materials include, but are not limited to, metal (e.g., Al, W, their alloys, etc.) or heavily doped Group IV semiconductor, such as silicon (e.g., polysilicon), silicon germanium, silicon carbide, etc. The semiconductor may be p-type or n-type doped and have a doping concentration between $10^{17}$ cm$^{-3}$ and $10^{21}$ cm$^{-3}$.

The second material layer 104 includes a sacrificial material. Any sacrificial material that may be selectively etched compared to the first material may be used. For example, if the first material layer 102 is p-doped polysilicon, the sacrificial materials 104 may be intrinsic polysilicon (i.e., doping below $10^{16}$ cm$^{-3}$). Alternatively, the second material layer 104 may comprise a metal or an insulating material (e.g., silicon oxide, silicon nitride, etc.) that may be selectively etched with respect to the first mater layer 102. Alternatively, the first layer material 102 may be doped poly silicon and the sacrificial material layer 104 may be SiGe. The stack may be covered with a top layer of insulating material 106, such as silicon oxide or silicon nitride.

In an embodiment, a bottom layer of insulating material 107 may be deposited on the substrate 100 prior to the deposition of the stack of alternating layers of first 102 and second layers 104 and a top layer of insulating material 106 may be deposited over the stack. The top layer of insulating material 106 and the bottom layer of insulating material 107 may be silicon oxide or silicon nitride. In one embodiment, layers 106 and 107 are made of the same material as layers 104 (e.g., silicon oxide). When making the U-shaped channel of an embodiment of the invention, a layer of sacrificial material 111 is preferably deposited in trenches formed in the substrate 100 prior to depositing the stack of alternating layers of first 102 and second layers 104 or the bottom layer of insulating material 107. Layer 111 may be deposited in the trenches in the substrate and over the substrate and then planarized with the top of the substrate surface 100A such that regions of layer 111 remain only in the trenches. Alternatively, layer 111 may be patterned into segments or regions shown in FIG. 1A followed by forming another layer to fill the spaces between the segments. The sacrificial material 111 is preferably different from the second, sacrificial material layer 104. For example, if the second, sacrificial material layer 104 is an oxide, such as silicon oxide, then the sacrificial material 111 may be a nitride, such as silicon nitride. As discussed in more detail below, the sacrificial material 111 may be removed via vertical memory holes etched in the stack of alternating layers of first 102 and second layers 104 and replaced with a semiconductor material to form the horizontal or connecting portion of the U-shaped channel. In an embodiment, an air gap trench may be left between the horizontal portion of the U-shaped channel and the stack such that the connecting portion of the semiconductor channel is located below the air gap.

After deposition of the layers 102 and 104, the stack may be etched to form memory openings 108 and slit trenches 110. The slit trenches 110 may be filled with a sacrificial material 110A, such as silicon nitride or another material which can be selectively etched compared to materials of layer 102 and 104, while the channels of the memory cells are subsequently formed in the memory holes 108. For example, the slit trenches 110 may be formed first using lithography and etching, then the trenches 110 may be filled with the sacrificial material 110A, followed by formation of the memory openings 108 using another lithography and etching step. The memory openings 108 may have a cylindrical shape or a slit/rail shape. For convenience, the memory openings 108 will be described below as having a cylindrical shape.

When etching conventional stacks having numerous alternating layers 102 and 104, such as eight or more layers, such as 8-64 layers, to form each of the memory openings 108 and the slit trenches 110 with a one step etch process (e.g., with a fluorine based etch) one or more of the memory openings 108 may penetrate through the layer of sacrificial material 111 into bottom conductor layer (not shown) due to a lack of etch selectivity between the materials of the second, sacrificial layers 104 and the sacrificial feature 111. When these memory openings 108 are filled with semiconducting material to form the channels, short circuits are created via semiconductor or conductive portion(s) of the substrate 100.

One conventional method of addressing this problem is to provide a thicker bottom insulating layer 107. However, improvement in the etching profile may to be difficult to achieve with this method. Another conventional method is to etch the layers 102, 104 step by step by alternating with a highly selective etches. However, for large stacks, this method requires a large number of separate etch steps which slows throughput and complicates the memory opening 108/slit trench 110 formation steps. Additionally, to achieve high selectivity, high polymerization plasma is used, which may cause to formation of etching stoppages or blockages. Further, this method tends to suffer from higher reactive ion etching (RIE) lag (a phenomena in which smaller trenches etch at a slower rate than larger trenches) and RIE microloading (a phenomena in which the etch rate depends on the pattern density).

The inventors discovered that with the addition of at least one etch stop layer 109 below the stack of layers 102, 104, large multilayer stacks can be etched using a one step etch process without penetrating through the sacrificial feature 111 into the substrate 100 (e.g., into an electrode in a substrate). In the embodiment illustrated in FIG. 1A, the etch stop layer 109 is located above layer 111, between the substrate 100 and the bottom insulating layer 107. The etch stop layer may be made of a mid-k to high-k metal oxide, such as an aluminum based dielectric (e.g., stoichiometric $Al_2O_3$ or non-stoichiometric aluminum oxide) or a titanium based dielectric (e.g., stoichiometric $TiO_2$ or non-stoichiometric titanium oxide), or nitrogen doped silicon carbide (e.g., silicon carbonitride, SiC(N)) which is resistant to fluorine based plasma. Alternatively, the etch stop layer may comprise aluminum nitride, aluminum oxynitride, silicon carbide or another suitable etch stop material. The etch stop is typically thin, such as 10-70 nm, such as 20-50 nm.

To form the slit trenches 110, a first non-selective slit trench 110 etch is performed through a mask to etch the stack of alternating layers of first and second layers 102, 104 down to the etch stop layer 109. This etch may be performed with either a wet etch, such as phosphoric acid or with a non-selective reactive ion etching process, such as with $NF_3$. Etching with the first non-selective etch is then stopped and the slit trenches 110 are filled with a sacrificial etch stop material 110A. The slit trenches 110 may be filled with any suitable material 110A such as stoichiometric or non-stoichiometric, $AlO_x$, AlN, AlON, SiN, SiC, SiCN, TiN and/or $TiO_x$.

A memory opening 108 etch is then performed. A first non-selective memory opening 108 etch is performed through a mask to etch the stack of alternating layers of first and second layers 102, 104 down to the etch stop layer 109. This etch may be performed with either a wet etch, such as phosphoric acid or with a non-selective reactive ion etching process, such as with $NF_3$. A second etch is then performed with an etchant suitable for etching the etch stop layer 109. For example, if the etch stop layer is made of an aluminum based dielectric or a titanium based dielectric, then the etch stop layer 109 may be etched with a chlorine based etchant, such as $Cl_2$ or $BCl_3$. If the etch stop layer is made of SiC(N), then a different fluorine based etchant (e.g., $CF_4$) from that used to etch the first and second layers 102, 104 may be used.

Figure 1B:
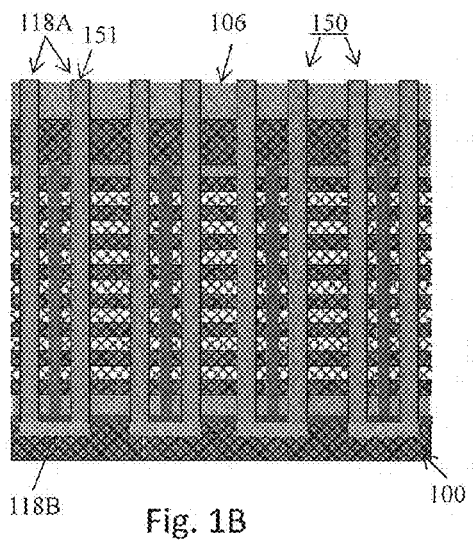
FIG. 1B is a schematic side cross sectional view illustrating another step in the method of making a three dimensional memory device.

In an embodiment, the memory cells 150 (e.g., vertical NAND strings) may be formed with a series of conformal deposition steps of the memory film and channel column portions 151 of the memory cells 150 in the memory holes 108, as shown in FIG. 1B. Conformal deposition techniques include, but are not limited to, atomic layer deposition (ALD) and chemical vapor deposition (CVD).

Figure 2:
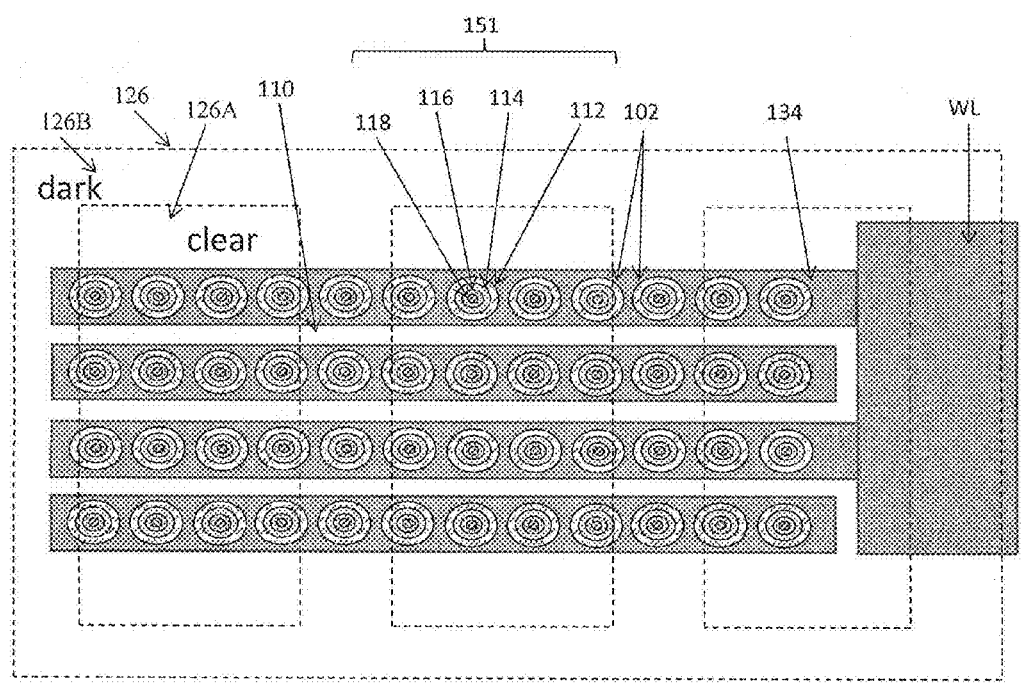
FIG. 2 is a plan view of a memory device according to an embodiment. Also illustrated is a support mask layout that may be used in the method of FIG. 1.

For example, as shown in FIG. 2, a layer of blocking dielectric 112 may first be conformally deposited in the memory holes 108. Next, a layer of charge storage or charge trapping material 114 may be conformally deposited on the layer of blocking dielectric 112 in the memory holes 108. A layer of tunnel dielectric 116 may then be conformally deposited on the charge storage material 114 in the memory holes 108. The central portion of the memory opening 108 may then be filled with a semiconductor channel material 118, such as polysilicon.

The channel 118 material may comprise lightly doped p-type or n-type (i.e., doping below $10^{17}$ $cm^{-3}$) semiconductor material (e.g., polysilicon). An n-channel device is preferred since it is easily connected with n+ junctions (i.e., source and drain n+ doped regions having a doping concentration between $10^{17}$ $cm^{-3}$ and $10^{21}$ $cm^{-3}$ located at the opposite ends of each channel). However, a p-channel device may also be used. Other semiconductor materials (e.g., SiGe, SiC, Ge, III-V, II-VI, etc.) may also be used.

The blocking dielectric 112 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 112 may have a thickness of 6 to 20 nm. The charge storage region 114 may comprise a polysilicon floating gate or a silicon nitride layer deposited by any suitable method, such as ALD, CVD, etc., and have a thickness of 2 to 10 nm. The tunnel dielectric 116 may comprise a relatively thin insulating layer (e.g., 4 to 10 nm thick) of silicon oxide or other suitable material, such as silicon oxynitride, oxide and nitride multi layer stacks, or a high-k dielectric (e.g., hafnium oxide), deposited by any suitable method, such as ALD, CVD. In an alternative configuration, the charge storage material 114 may be formed of a multilayer composite, such as an oxide-nitride-oxide (ONO) multilayer, and/or the blocking dielectric 112 may comprise a tri-layer ONO dielectric.

The result of the conformal depositions is formation of memory cell 150 columns 151 substantially perpendicular to the major surface 100A of the substrate 100. Each memory cell column 151 includes a semiconductor channel core 118, a first shell of tunnel dielectric 116, a second shell of charge storage material 114 and a third shell of blocking dielectric 112. The blocking dielectric layer, the charge storage material (i.e., the charge trapping layer), and a tunnel dielectric layer extend substantially perpendicular to the major surface 110A of the substrate 100 between the semiconductor channel 118 and the plurality of control gate electrodes 102. In an alternative embodiment, the semiconductor channel core 118 may include an inner core of insulating material surrounded by a shell of semiconductor material.

Figure 1C:
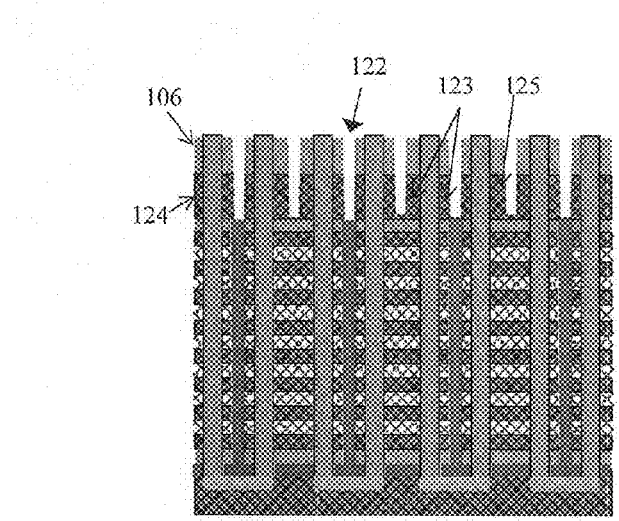
FIG. 1C is a schematic side cross sectional view illustrating another step in the method of making a three dimensional memory device.
Figure 1D:
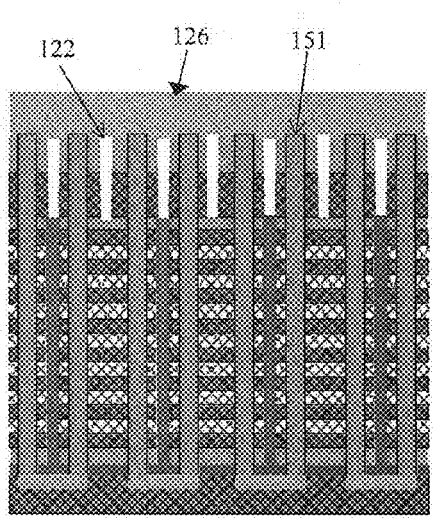
FIG. 1D is a schematic side cross sectional view illustrating another step in the method of making a three dimensional memory device.
Figure 1E:
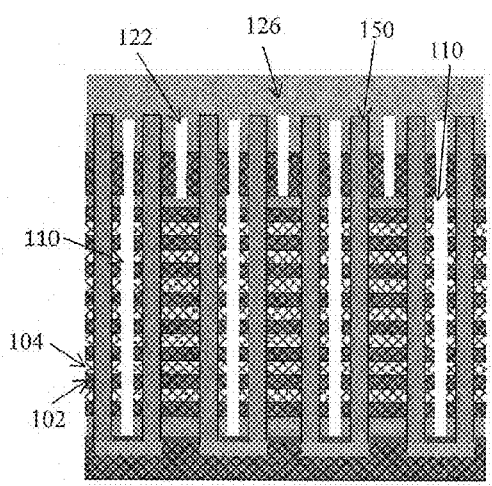
FIG. 1E is a schematic side cross sectional view illustrating another step in the method of making a three dimensional memory device.
Figure 1F:
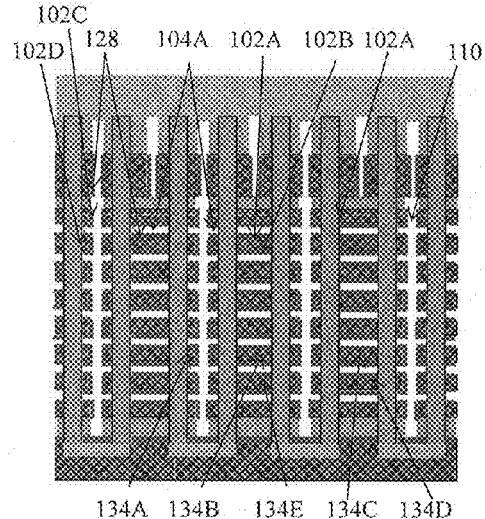
FIG. 1F is a schematic side cross sectional view illustrating another step in the method of making a three dimensional memory device.

In an embodiment, a surface 102D of the control gate layer 102 directly, physically contacts the blocking dielectric layer 112, as shown in FIGS. 1F and 2.

Figure 3:
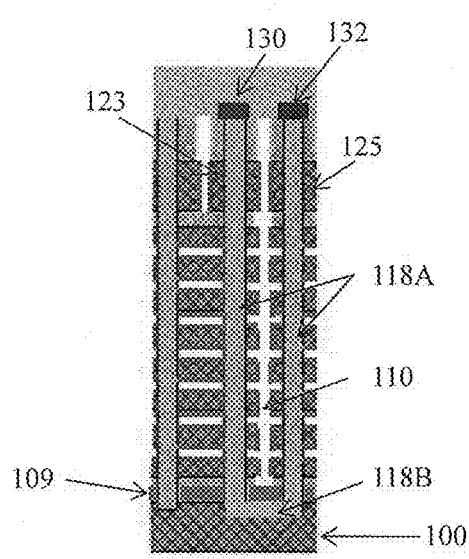
FIG. 3 is a side cross sectional view of a vertical NAND string according to an embodiment.

As illustrated in FIG. 1C, the top layer of insulating material 106 may then be etched to expose openings 122 in a top layer of semiconducting material 124 to form upper select gates 123, 125. The memory cells 150 are configured with U-shaped channels 118 and the select gates include respective drain select gates and source select gates 123, 125 at the upper end of each respective wing portion 118A of the U-shaped channel 118, as shown in FIGS. 1C and 3. The channel wing portions 118A are connected by the horizontal channel 118B located in or on the substrate 100.

In a non-limiting embodiment shown in FIGS. 1D and 2, the control gates are silicided, as described in U.S. patent application Ser. No. 13/443,287, filed on Apr. 10, 2012 and incorporated herein by reference for a teaching of a method of making silicided control gates and the NAND device with such gates. In this embodiment, a support mask 126 may be deposited over the top layer of insulating material 106 after the openings 122 are formed. The support mask 126 provides support to the memory device after the layers of sacrificial materials 110A and 104 are removed. The support mask 126 may be made of any suitable material, such as an oxide or nitride hard mask material. As shown in FIG. 2, the mask 126 may be a mesh shaped mask which includes clear or open gap portions 126A surrounded by dark or solid cross bar mesh support portions 126B.

In the next step, as illustrated in FIG. 1E, the sacrificial material 110A in the slit trenches 110 may be removed. This removal may be accomplished by selectively etching (e.g., wet etching) the sacrificial material 110A in the trenches 110 through the gaps 126A in the mask 126 without etching the other materials or layers in the device. Removing the material 110A in the trenches 110 exposes the side edges of layers of sacrificial material 104 in the stack.

The layers of sacrificial material 104 may then be removed by selective etching (e.g., wet etching) through the slit trenches 110, as illustrated in FIG. 1F. This results in terraces of exposed control gate 102 material which are supported by the memory cell columns 151. The support mask 126 provides additional support to the memory cell columns 151. The control gates 102 are separated in the vertical direction by the air gaps 104A where the sacrificial material layers 104 were previously located and in the horizontal direction by the slit trenches 110.

After formation of the air gaps 104A, the exposed surfaces of the control gates 102 may be silicided to form a silicide layer 128 on the exposed surfaces of the polysilicon control gates 102. The silicide layer 128 may be formed by conformally depositing a thin layer of metal, such as tungsten, cobalt, nickel or titanium, or a combination of two or more of these metals, on the exposed control gate polysilicon material and heating the device to react the thin layer of metal with the control gate material. The metal layer may be formed through the gaps 126A in the mask 126 and through the trenches 110 and air gaps 104A. The silicide layer 128 may be formed on the upper 102A and lower 102B surfaces of the exposed control gates 102 as well as on the exposed face 102C of the control gate 102 opposite the face 102D that contacts the charge storage region 112 of the memory device 150. The upper and lower surfaces 102A, 102B of the control gates 102 are positioned substantially parallel to the major surface 100A of the substrate 100, while edge surfaces or faces 102C, 102D of the control gate 102 are positioned substantially perpendicular to the major surface 100A of the substrate 100. The silicide layer 128 may also be formed on the side wall of the select gates 123, 125 exposed in the trenches 122.

In an alternative embodiment, the mask 126 and silicide layer 128 may be omitted. Furthermore, the air gaps 104A and/or air gap slit trenches 110 may be omitted and instead layers 104 and/or trench etch stop material 110A may remain in the completed device.

In the completed device, the each memory cell includes a source electrode 130 and a drain electrode 132. Methods of making the source electrode 130 and a drain electrode 132 are described in co-pending U.S. patent application Ser. Nos. 12/827,947 and 13/083,775, hereby incorporated by reference. In a U-shaped channel configuration shown in FIG. 3, both the source and drain electrodes 132, 130 may be formed contacting the source and drain regions at the top of the wings 118A of the vertical memory column(s) 151.

Figure 4:
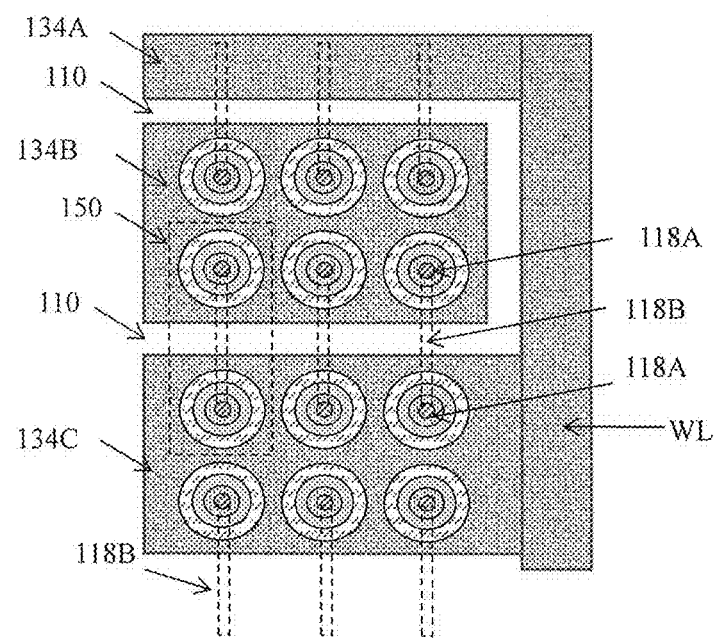
FIG. 4 is a plan view of a memory device according to an embodiment.

As illustrated in FIGS. 2 and 4, the control gates 102 in adjacent memory cells 150 in a device level may be connected to each other in a strip 134. The strips 134 connected to a given word line may be combed shaped and strips connected to adjacent word lines may be interdigitated as shown in FIG. 2. As noted above, the strips 134 and individual control gates 102 may be considered portions of the word line rather than discreet elements.

In the embodiment illustrated in FIG. 2, the control gate strips 134 surround a single row of memory cell 150 pillars 151. As illustrated in FIG. 4, each control gate 102 strip 134 may surround two rows of pillars 151 (i.e., wings 118A) of adjacent NAND strings (i.e., memory cells) 150.

In the U-shaped channel configuration of FIG. 3, the horizontal channel portion 118B of the U-shaped channel 118 connects adjacent channel wing portions 118A under the slit trenches 110 under the etch stop layer 109, as shown in FIGS. 3 and 4. Thus, the horizontal portion 118B of the U-shaped channel 118 extends substantially perpendicular to the elongation direction of the strips 134 of control gates 102. The source select gates 123 of adjacent memory cells may be connected to each other via a source line while the drain select gates 125 of adjacent memory cells may be connected to each other via a bit line (not shown). While the U-shaped NAND strings 150 are illustrated with the control gate strip 134 surrounding two rows of pillars 151 configuration of FIG. 4, it should be understood that the U-shaped NAND strings 150 may also be used with the control gate strip 134 surrounding one row of pillars 151 configuration of FIG. 2.

FIG. 4 illustrates three control gate strips 134A, 134B and 134C located in the same device level. Control gate strip 134B is located between strips 134A and 134C. Control gate strips 134A and 134C are electrically connected to the same word line WL, while control gate strip 134B is electrically connected to a different word line (not shown), such that strip 134B is interdigitated between strips 134A and 134C in the same device level. The strips 134A, 134B and 134C are separated from each other by air gap trenches 110. A first wing portion 118A of the semiconductor channel 118 of the NAND string 150 (shown by dashed lines) extends through and is surrounded by strip 134C (as well as other strips located above and below strip 134C, such as strip 134D shown in FIG. 1F). The second wing portion 118A of the semiconductor channel 118 extends through and is surrounded by strip 134B (as well as other strips located above and below strip 134B, such as strip 134E shown in FIG. 1F). The connecting portion 118B (shown in dashed lines) of the semiconductor channel 118 is located below the air gap trench 110 which separates the strips.

Figure 5A:
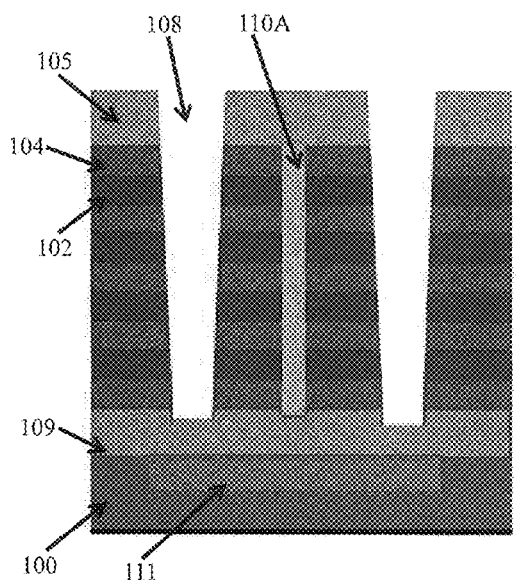
FIG. 5A is a schematic side cross sectional view illustrating an embodiment of a three dimensional memory device with a continuous etch stop layer.
Figure 5B:
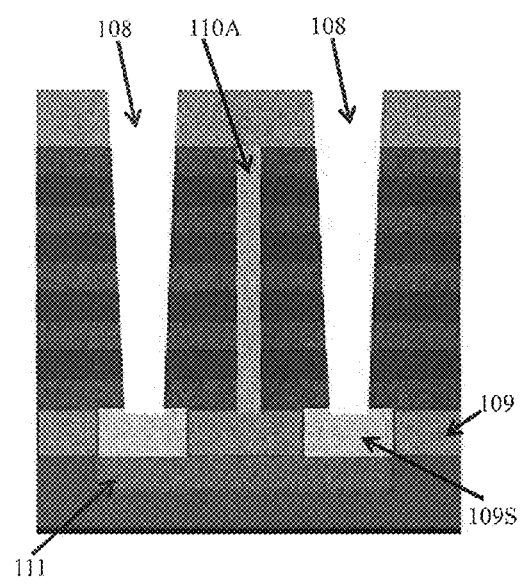
FIG. 5B is a schematic side cross sectional view illustrating an embodiment of a three dimensional memory device with modified etch stop layer.
Figure 6A:
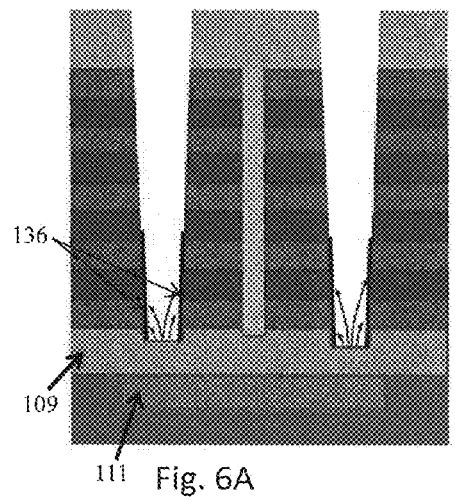
FIG. 6A is a schematic side cross sectional view illustrating the formation of metal stringers in the memory hole of an embodiment with a continuous etch stop layer.
Figure 6B:
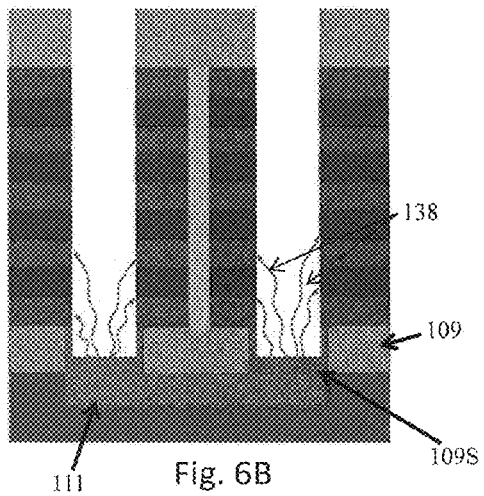
FIG. 6B is a schematic side cross sectional view illustrating the widening of the bottom of a memory hole by increased ion bombardment of an embodiment with modified etch stop layer.

In a preferred embodiment, the inventors have discovered that the use of a modified etch stop which contains etch through regions may provide improvements in forming three dimensional vertical memory devices. As illustrated in FIGS. 5A and 6A, the memory openings 108 in the stacks of first and second layers 102, 104 tend to narrow towards the bottom of the memory holes 108. Additionally, as illustrated in FIG. 6A, the reactive ion etching process used to etch the memory openings 108 tends to decompose the etch stop layer 109, resulting in metal stringers 136 depositing on the sides of the memory holes 108 when layer 109 contains a metal (e.g. a metal oxide etch stop layer 109). However, use of a modified etch stop, an embodiment of which is illustrated in FIG. 5B, may yield a memory opening 108 with a wider bottom and without the formation of metal stringers 136 on the sides of the memory holes 108. In the embodiment illustrated in FIGS. 5B and 6B, the modified etch stop layer includes sacrificial "etch through" portions 109S described in more detail below. Other embodiments of modified etch stops are also described below.

In a first embodiment, portions of the etch stop layer 109 located below the memory openings 108 are removed and replaced with a sacrificial, etch through material 109S with a high etch rate (i.e., a material with an etch rate higher than the etch stop material 109). During reactive ion etching of the memory hole 108, the sacrificial etch through material 109S may decompose into benign materials 138 which widen the bottom of the memory opening 108 due to ion bombardment of the sidewalls of the memory opening 108 by the decomposition products of the sacrificial etch through material 109S instead of forming metal stringers 136. For example, if the sacrificial etch through 109S is made of silicon, germanium, silicon germanium, silicon carbide or carbon, then decomposition of sacrificial etch stop layer 109S results in the formation of silicon, germanium or carbon ions which may further etch the bottom of the memory hole 138 without forming metal stringers. In alternative embodiments discussed in more detail below, portions of the etch stop layer 109 may be ion implanted with ions that increase the rate of etching of the etch stop layer 109, thereby forming regions of high etch rate through material 109H (i.e., etch through regions having a higher etch rate than the remaining etch stop material) separated by regions comprised of non-implanted etch stop layer 109. Alternatively, portions of the etch through layer 109H made of a relatively high etch rate material may be ion implanted with ions that decrease the rate of etching of the etch stop layer 109, thereby forming regions of low etch rate stop material 109L, as will be discussed below. Polysilicon, silicon germanium or silicon carbide can be used as an etch stop material and by ion implantation with a suitable species or by tuning the ion implantation dose or by both, the rate of etching can be tuned to either increase or decrease, with respect to regions that are not implanted. For example, ion implantation with 10 to 25 keV Ga$^+$ ions and an implanted dose range of $1 \times 10^{13}$-$1 \times 10^{16}$ ions/cm$^2$ is expected to decrease the rate of etching while increasing the dose $>5 \times 10^{16}$ ions/cm$^2$ is expected to induce ion-implantation induced damage and thereby, increase the rate of etching. Non-limiting examples of other species that can be implanted to tune rate of etching are boron, oxygen, nitrogen or carbon.

Figure 7A:
FIG. 7A is a schematic side cross sectional view illustrating a step in a method of making a three dimensional memory device according to an embodiment.
Figure 7B:
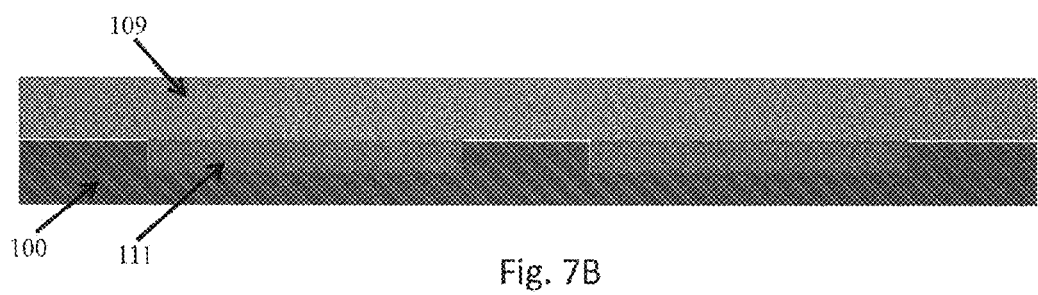
FIG. 7B is a schematic side cross sectional view illustrating another step in the method of making a three dimensional memory device according to an embodiment.

FIGS. 7A-7J illustrate a method of making a three dimensional vertical memory device, such as a monolithic, three dimensional vertical NAND string according to an embodiment. In a first step illustrated in FIG. 7A, one or more sacrificial features 111, such as sacrificial material regions (e.g. SiN$_x$, amorphous carbon (a-C), amorphous silicon (a-Si), etc.) are formed in a recess in a substrate 100. Next, as illustrated in FIG. 7B, an etch stop layer 109 is formed over the sacrificial features 111 and the substrate 100. The etch stop layer 109 may be made aluminum oxide, aluminum nitride, aluminum oxynitride, hafnium oxide, tantalum oxide, boron nitride or boron carbide or combinations thereof. The etch stop layer 109 may have a thickness of 10 to 50 nm.

Figure 7C:
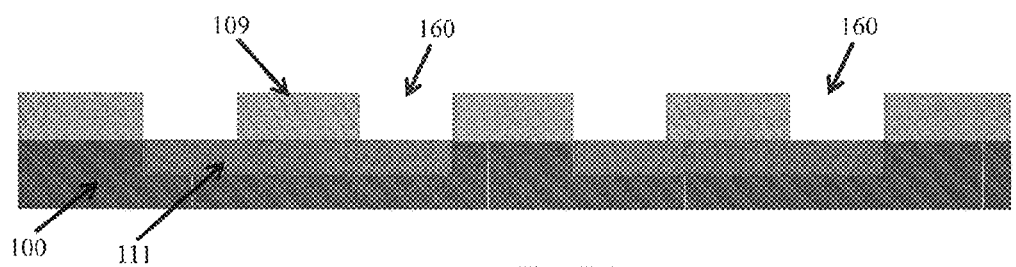
FIG. 7C is a schematic side cross sectional view illustrating another step in the method of making a three dimensional memory device according to an embodiment.

As illustrated in FIG. 7C, the etch stop layer 109 is patterned. Patterning may be performed by any suitable method, such as lithography and etching. The openings 160 formed in the etch stop layer 109 may be rail (e.g. slit) shaped or cylindrical shaped. That is, the openings 160 may be formed as continuous slits above which several memory openings 108 may be formed, or individual cylindrical shaped openings 160 may be formed for each respective memory hole 108.

Figure 7D:
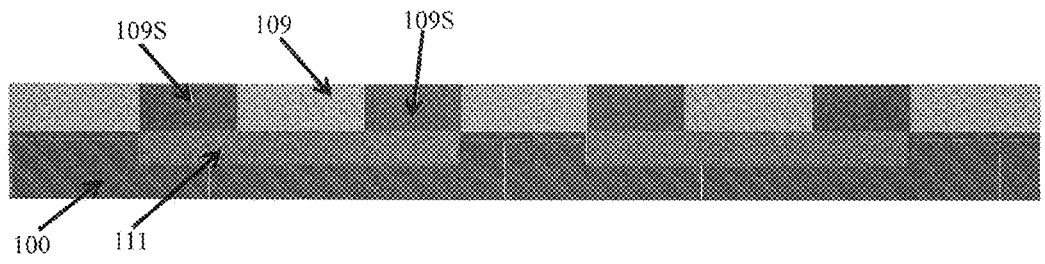
FIG. 7D is a schematic side cross sectional view illustrating another step in the method of making a three dimensional memory device according to an embodiment.

Next, as illustrated in FIG. 7D, the openings 160 are then filled with an easy to remove etch through material 109S, such as a-Si, a-C, SiGe$_x$, SiC$_x$, Ge or any other suitable material. In an embodiment, the etch through material 109S may include one or more elements with a high atomic mass compared to Si, such as a refractory metal, such as tungsten and/or titanium. For example, the etch through material 109S may be a refractory metal (e.g., W and/or Ti), a refractory metal nitride (e.g., tungsten or titanium nitride) or a refractory metal silicide (e.g., tungsten or titanium silicide). The high atomic mass elements facilitate enhanced etching via ion-impingement and re-sputtering. In another embodiment, the etch through material 109S may have an increased chemical reactivity to etch reactant and/or etch by-products relative to the material of etch stop layer 109 during reactive ion etching. During the reactive ion etching, ions of the refractory metal may impinge on a sidewall of the plurality of openings to at least widen a diameter of a lower portion of the openings in the stack or to remove stringer residue on the sidewall of the plurality of the openings. In an embodiment, the etch through material 109S includes both one or more high atomic mass elements and an increased chemical reactivity. Preferably, after deposition of the etch through material 109S, the surface is planarized with chemical-mechanical polishing (CMP) or reactive ion etch (RIE) etch-back step.

Figure 7E:
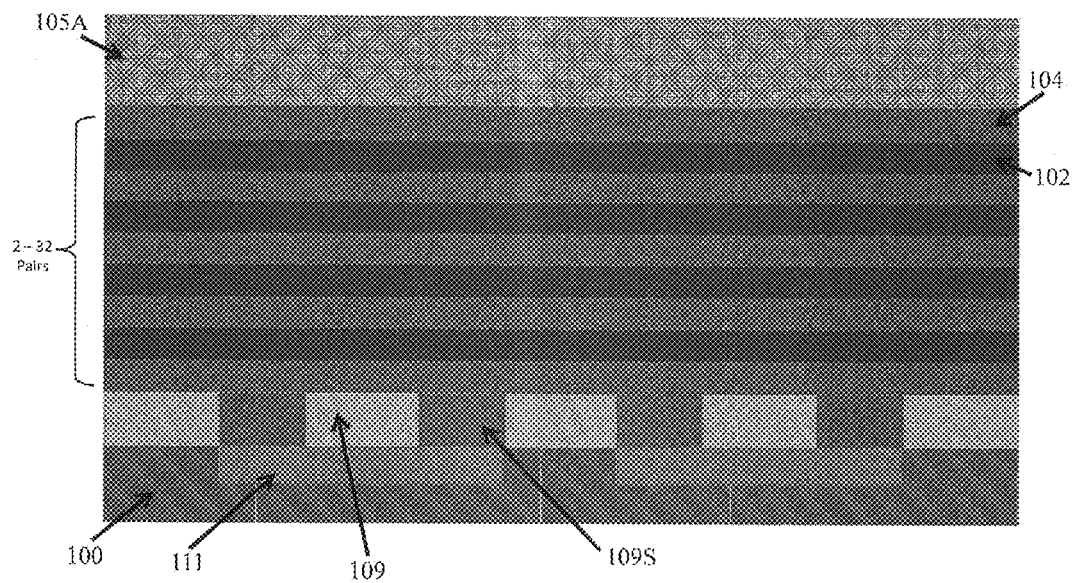
FIG. 7E is a schematic side cross sectional view illustrating another step in the method of making a three dimensional memory device according to an embodiment.
Figure 7F:
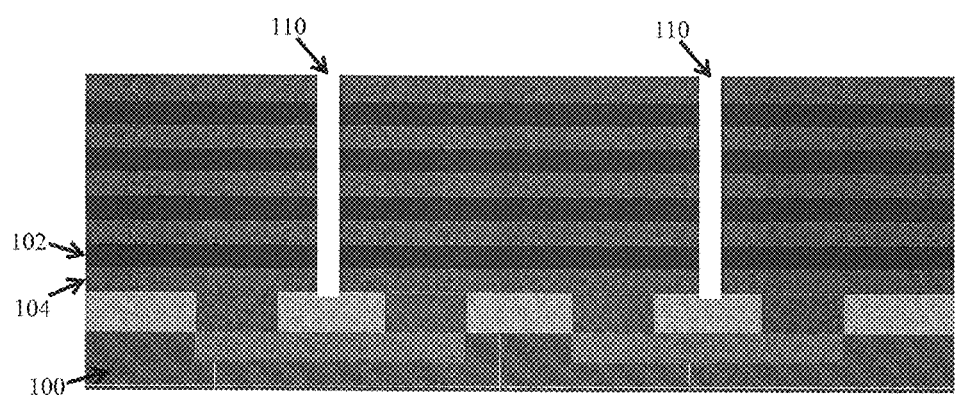
FIG. 7F is a schematic side cross sectional view illustrating another step in the method of making a three dimensional memory device according to an embodiment.
Figure 7G:
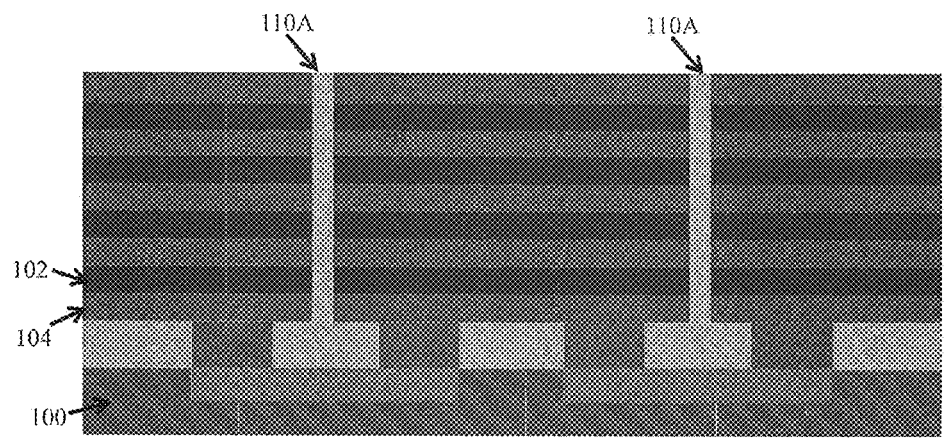
FIG. 7G is a schematic side cross sectional view illustrating another step in the method of making a three dimensional memory device according to an embodiment.

After planarization, a stack of first 102 and second 104 layers may be deposited as illustrated in FIG. 7E and described above. The stack may include 2-32 pairs of first and second layers 102, 104, such as 24-32 pairs of layers 102, 104. Optionally, more layers 102, 104 may be deposited. The stack of first and second layers 102, 104 may then be covered with a mask 105A, such as a hard mask. As illustrated in FIG. 7F, slit trenches 110 may then be formed in the stacks of first and second layers 102, 104. The etching of the slit trench 110 may be stopped when the slit trench reaches the etch stop layer 109. In an embodiment, etching of the slit trench 110 may include etching the stack of first and second layers 102, 104 to form a slit trench 110 up to or only partially through the etch stop region 109, such that the first and the second materials 102, 104 of the stack are etched preferentially compared to the etch stop material 109. As illustrated in FIG. 7G, the slit trenches 110 may be filled with SiN$_x$ or any other suitable sacrificial material 110A which is capable of withstanding high temperature annealing.

Figure 7H:
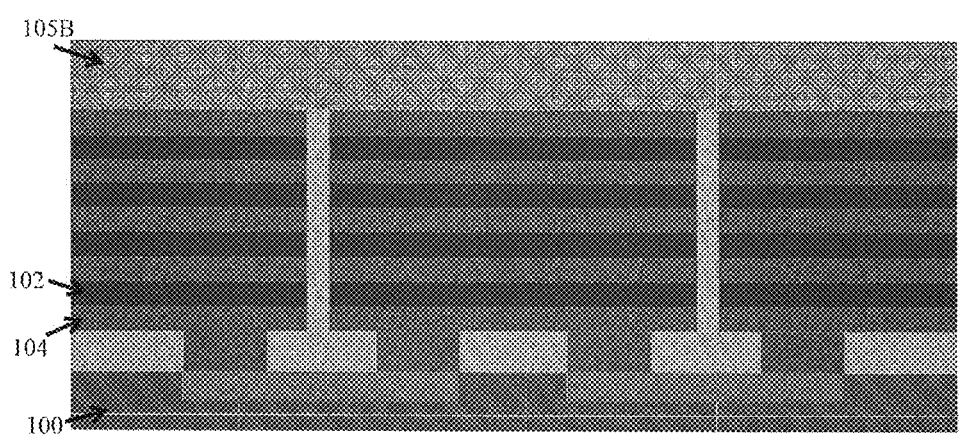
FIG. 7H is a schematic side cross sectional view illustrating another step in the method of making a three dimensional memory device according to an embodiment.

After filling the slit trenches 110, the top surface of the stack of first and second layers 102, 104 may be planarized by CMP or RIE. A second mask 105B, such as a hard mask that may be made of the same or different material from the first hard mask 105A, may then be deposited on the planarized stack as illustrated in FIG. 7H. As shown in FIG. 7H, the etch through regions 109S and the etch stop region 109 are located in a same horizontal plane above both the major surface of the substrate and the sacrificial feature 111, but below the stack. Preferably, the etch through material in the etch through regions 109S and the etch stop material in the etch stop region 109 form a substantially planar upper surface over which the stack is formed.

Figure 7I:
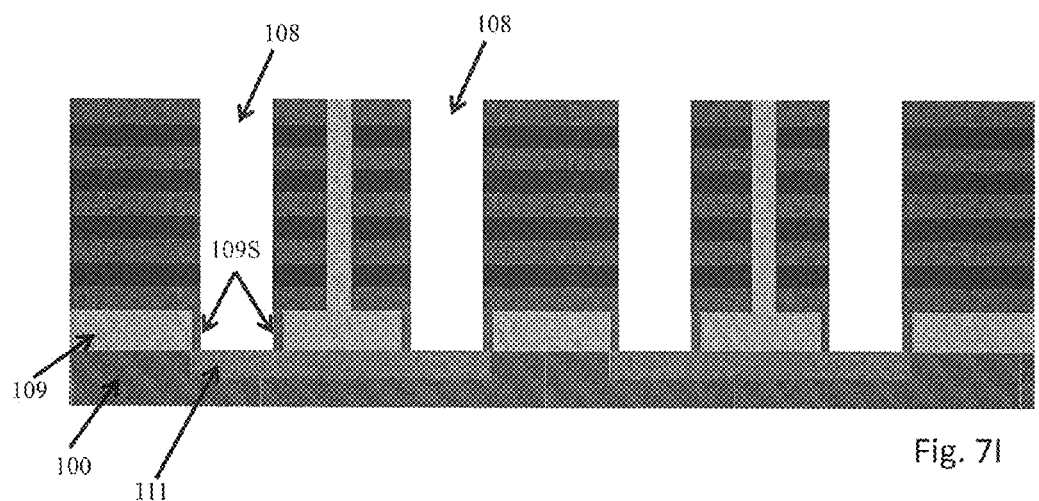
FIG. 7I is a schematic side cross sectional view illustrating another step in the method of making a three dimensional memory device according to an embodiment.

As illustrated in FIG. 7I, memory openings 108 may be formed in the stack of layers 102, 104, such as with RIE. That is, RIE may be used to etch the stack of first and second layers 102, 104 to form a plurality of memory openings 108 through the stack and through the etch through regions 109S to expose the sacrificial feature 111, such that the etch through material 109S is etched preferentially compared to the first and the second materials 102, 104 of the stack. The RIE process easily removes the etch through material 109S because it is made of an easier to etch material than that of etch stop layer 109 and optionally of that of layers 102, 104. In the embodiment illustrated in FIG. 7I, the memory opening 108 has a diameter smaller than the width or diameter of the etch through material 109S. In an alternative embodiment, the memory opening 108 has the same size diameter as the width or diameter of the etch through material 109S.

In an embodiment, the device includes two memory openings 108 extending to the same sacrificial feature 111 and the slit trench 110 is located between the two memory openings 108. The sacrificial feature 111 and the etch through material 109S may be the same material or a different material from each other.

Figure 8:
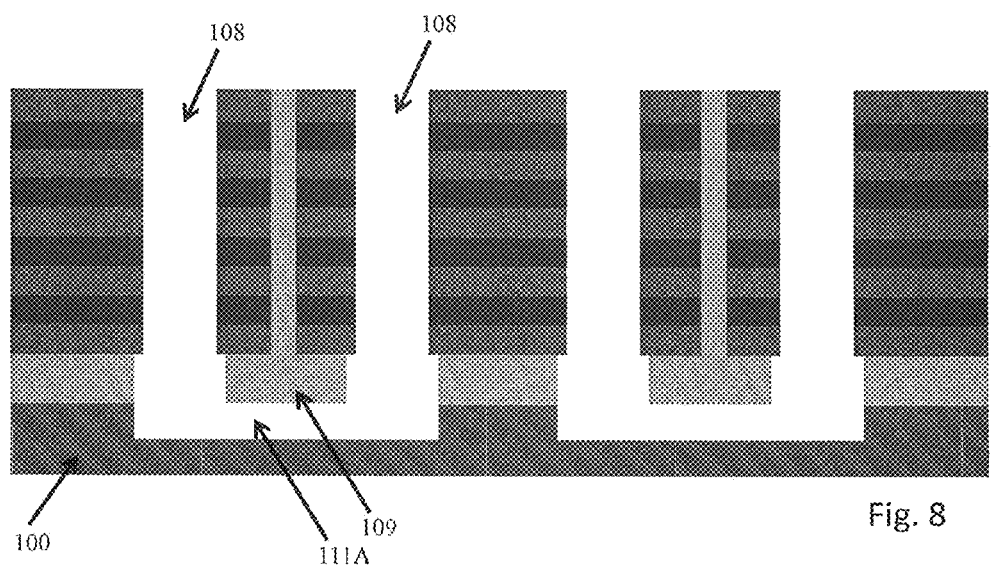
FIG. 8 is a schematic side cross sectional view illustrating another step in the method of making a three dimensional memory device according to an embodiment.

As illustrated in FIG. 8, the remaining etch through material 109S and the sacrificial feature 111 are removed through the memory openings 108 to form a hollow region (e.g., cavity) 111A which connects the memory openings 108 below the etch stop layer 109. This may be accomplished, for example, by selective wet etching.

In an alternative embodiment, etching the stack of first and second layers 102, 104 to form the memory openings 108 includes reactively ion etching the memory openings 108 through the stack up to or only partially through the etch through material in the etch through regions 109S using a first mask, and removing the sacrificial feature 111 includes selectively wet etching both the sacrificial feature 111 and the etch through material via the memory openings 108 in the same selective wet etching step.

The three dimensional memory device may be then be completed as discussed above in regards to FIGS. 1-4, e.g. by forming a blocking dielectric 112 in the memory openings 108, forming a charge storage layer 114 over the blocking dielectric 112, forming a tunnel dielectric 116 over the charge storage layer 114, and forming a semiconductor channel 118 over the tunnel dielectric 116. Thus, in the method illustrated in FIGS. 7A-7I and 8 and described above, the etch through material 109S is etched at a higher rate compared to the first and the second materials 102, 104 of the stack during the step of etching the stack to form the memory openings 108. In contrast, the first and the second materials 102, 104 of the stack are etched at a higher rate compared to the etch stop material 109 during the step of etching the stack to form the slit trench 110.

Figure 9A:
FIG. 9A is a schematic side cross sectional view illustrating a step in a method of making a three dimensional memory device according to an embodiment.
Figure 9B:
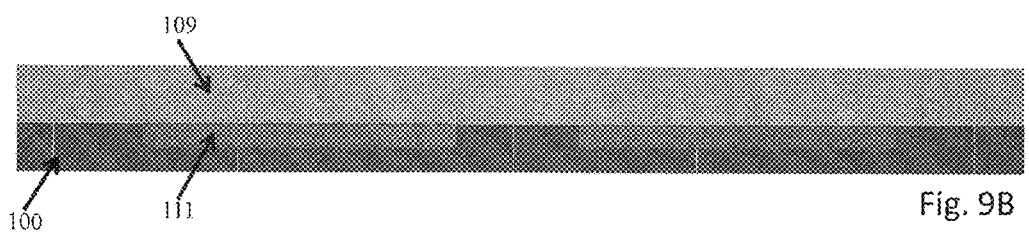
FIG. 9B is a schematic side cross sectional view illustrating another step in the method of making a three dimensional memory device according to an embodiment.

FIGS. 9A-9J illustrate another embodiment of a method of making a three dimensional vertical memory device in which the etch through regions are formed by ion implantation. In this embodiment, the first two steps as illustrated in FIGS. 9A-9B are the same as the steps illustrated in FIGS. 7A-7B. That is, sacrificial features 111 are formed in recesses in a substrate 100. Next, as illustrated in FIG. 9B, an etch stop layer 109 is formed over the sacrificial features 111 and the substrate 100.

Figure 9C:
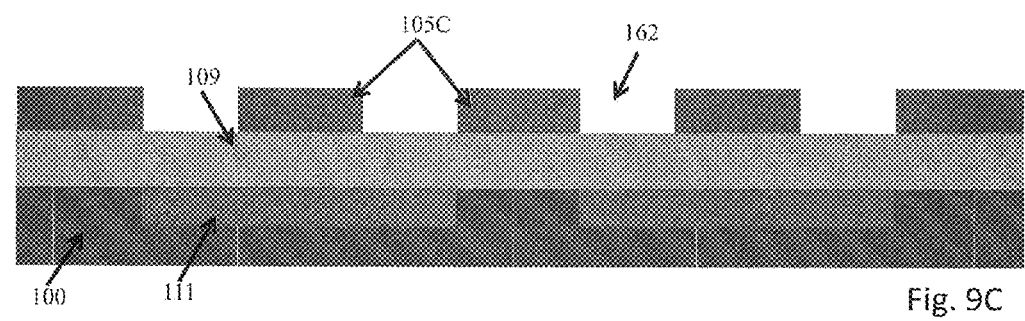
FIG. 9C is a schematic side cross sectional view illustrating another step in the method of making a three dimensional memory device according to an embodiment.

In contrast to the step illustrated in FIG. 7C, a mask layer 105C is deposited over the etch stop layer 109 as illustrated in FIG. 9C. The mask layer 105C is patterned, such as by lithography to form openings 162. Similarly to the embodiment illustrated in FIGS. 7A-7I and 8 the openings 162 formed in the mask layer 105C may be rail (slit) shaped or cylindrical shaped.

Figure 9D:
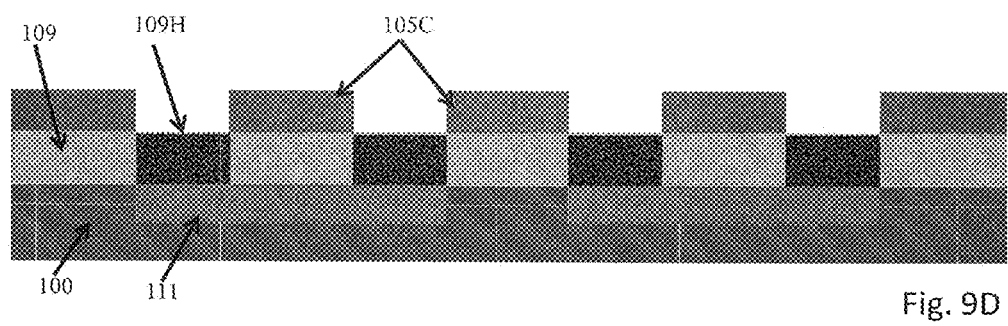
FIG. 9D is a schematic side cross sectional view illustrating another step in the method of making a three dimensional memory device according to an embodiment.

As illustrated in FIG. 9D, the etch stop layer 109 may be ion implanted to form high etch rate etch through regions 109H in the etch stop layer 109. In this embodiment, the regions 109H are configured to be located under the memory holes 108 which are formed subsequently. In an alternative embodiment discussed in more detail below with respect to FIGS. 16A-16B, the mask layer 105C may be patterned such that regions of the etch stop layer adjacent the memory holes are implanted with ions to form low etch rate regions 109L in the etch through layer 109H. That is, regions 109L may be implanted such that they have a lower etch rate than the non-implanted etch through layer 109H which forms the etch through regions.

Figure 9E:
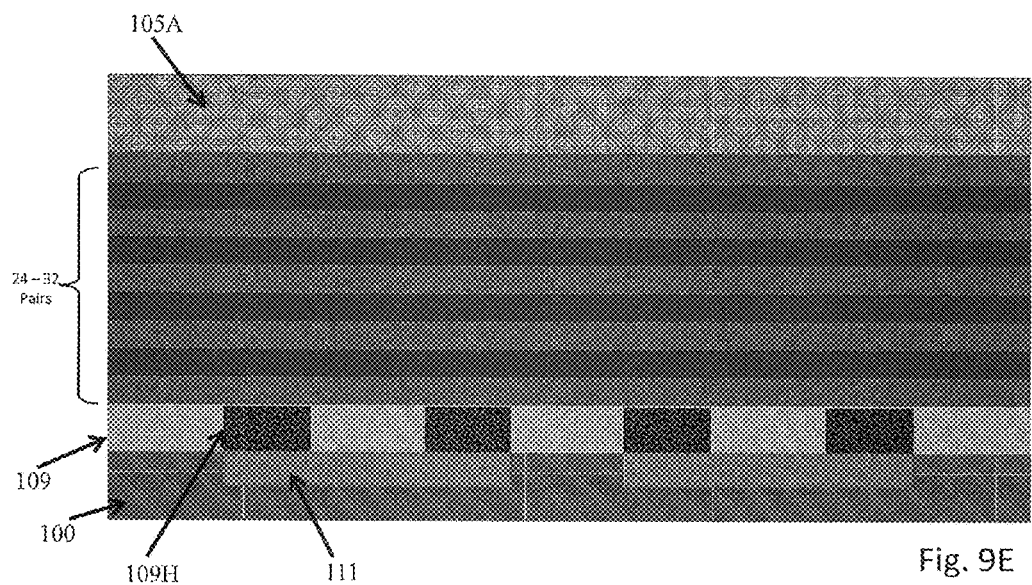
FIG. 9E is a schematic side cross sectional view illustrating another step in the method of making a three dimensional memory device according to an embodiment.

As illustrated in FIG. 9E, the mask layer 105C is removed and alternating layers of the first material 102 and the second material 104 are deposited to form a stack of first and second layers 102, 104. As in the previous embodiment, the stack may include 2-32 pairs of first and second layers 102, 104, such as 24-32 pairs of layers 102, 104. Optionally, more layers 102, 104 may be deposited. The stack of first and second layers 102, 104 may then be covered with a mask 105A, such as a hard mask.

Figure 9F:
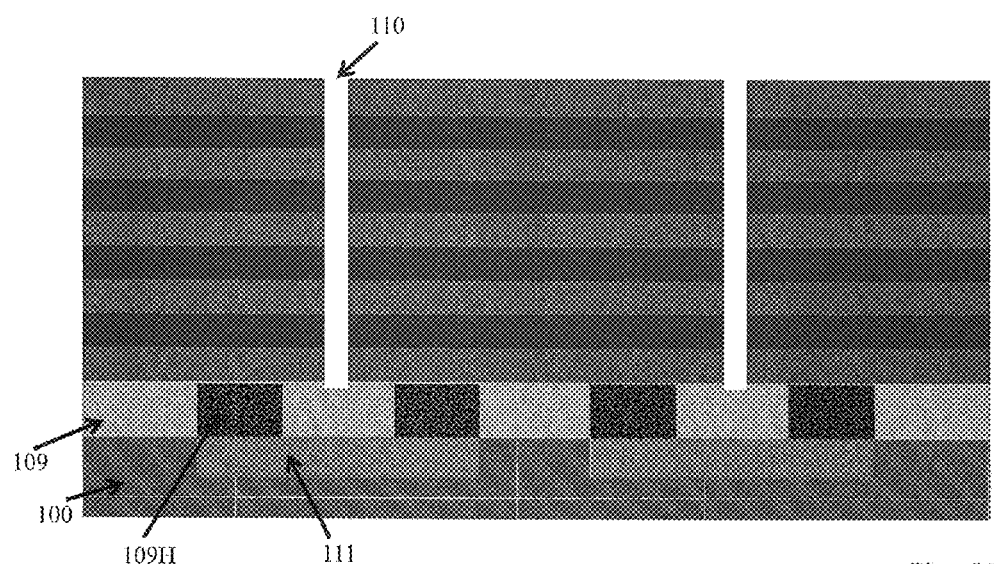
FIG. 9F is a schematic side cross sectional view illustrating another step in the method of making a three dimensional memory device according to an embodiment.
Figure 9G:
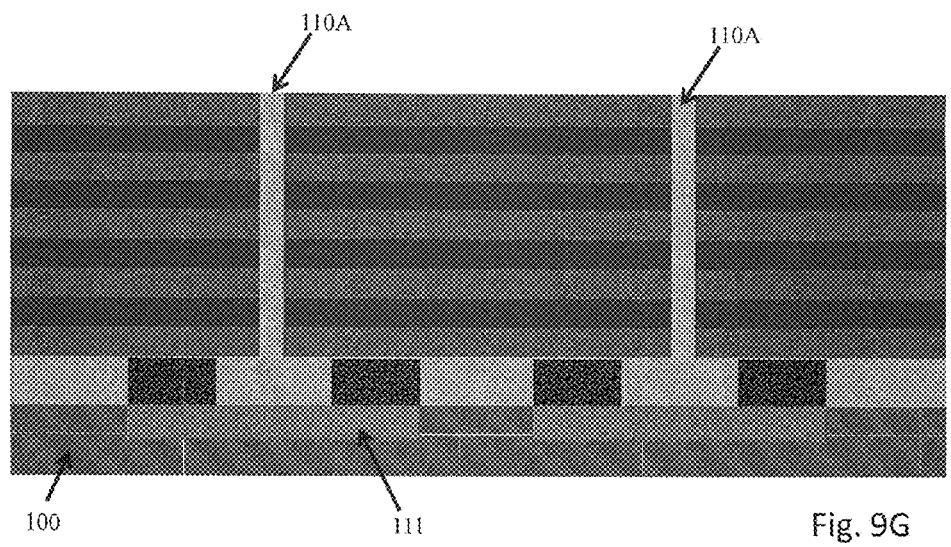
FIG. 9G is a schematic side cross sectional view illustrating another step in the method of making a three dimensional memory device according to an embodiment.

As illustrated in FIG. 9F, slit trenches 110 may then be formed in the stack of alternating first and second layers 102, 104. Next, as illustrated in FIG. 9G, the slit trenches 110 are filled with $SiN_x$ or other suitable sacrificial materials capable of withstanding high temperature annealing.

Figure 9H:
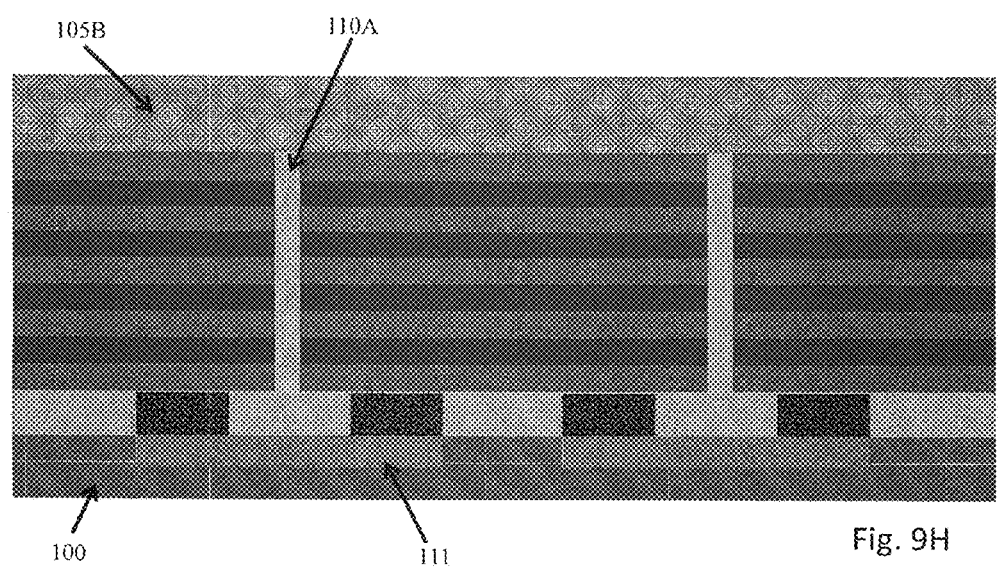
FIG. 9H is a schematic side cross sectional view illustrating another step in the method of making a three dimensional memory device according to an embodiment.
Figure 9I:
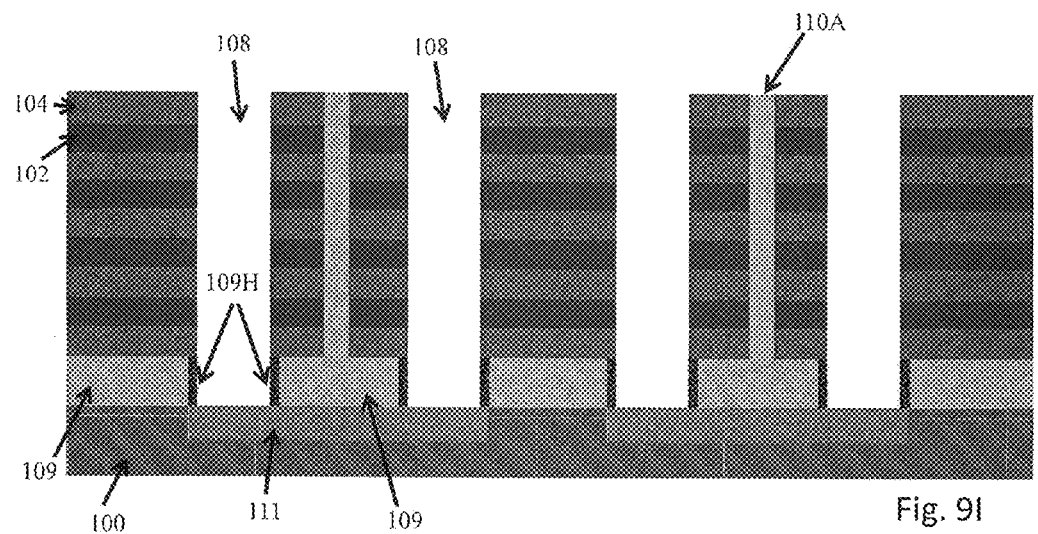
FIG. 9I is a schematic side cross sectional view illustrating another step in the method of making a three dimensional memory device according to an embodiment.

After filling the slit trenches 110, the top surface of the stack of first and second layers 102, 104 may be planarized by CMP or RIE. A mask 105B, such as a hard mask, may then be deposited on the planarized stack as illustrated in FIG. 9H. As illustrated in FIG. 9I, memory openings 108 may be formed in the stack of layers 102, 104, such as with RIE. The RIE process easily removes the material in the high etch rate regions 109H because the material has a higher etch rate than the remaining layer 109. In the embodiment illustrated in FIG. 9I, the memory opening 108 has a diameter smaller than the width or diameter of the high etch rate (i.e. etch through) region 109H. In an alternative embodiment, the memory opening 108 has the same size width or diameter as the width or diameter of the high etch rate regions 109H.

Figure 9J:
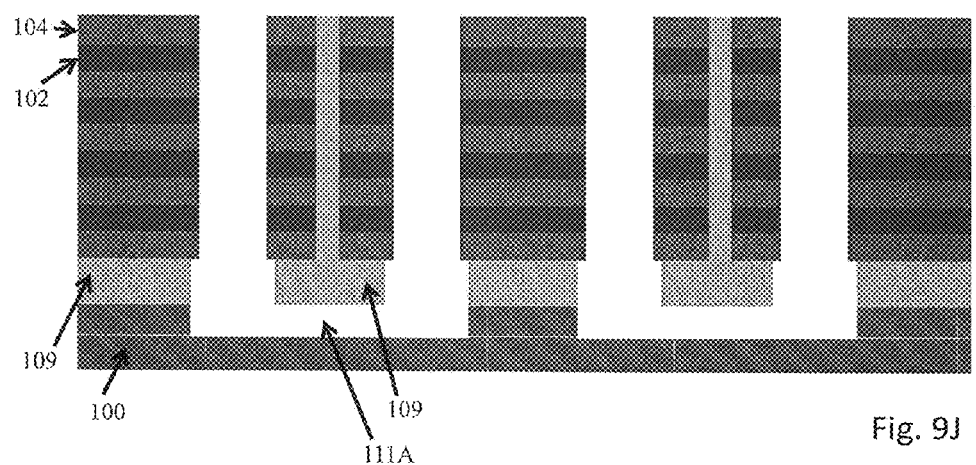
FIG. 9J is a schematic side cross sectional view illustrating a three dimensional memory device according to an embodiment.

As illustrated in FIG. 9J, the remaining etch through material 109H and the sacrificial feature 111 are removed. The remaining etch through material 109H and the sacrificial feature 111 may comprise the same material (e.g., germanium) and may be removed in the same removal step. This may be accomplished, for example, by selective wet etching to form the memory openings 108 connected by the hollow region 111A. The three dimensional memory device may then be completed as discussed above in regards to FIGS. 1-4. Thus, in the embodiment of FIGS. 9A-9J, forming the etch through regions and the etch stop region comprises forming the etch stop layer 109 of the etch stop material over the sacrificial feature 111, forming a mask 105C over the etch stop layer 109 such that a plurality of substantially cylindrical or substantially rail shaped regions in the etch stop layer 109 are exposed in the mask 105C, and ion implanting the exposed substantially cylindrical or substantially rail shaped regions in the etch stop layer to convert the etch stop material to the etch through material in the exposed substantially cylindrical or substantially rail shaped regions.

Figure 9K:
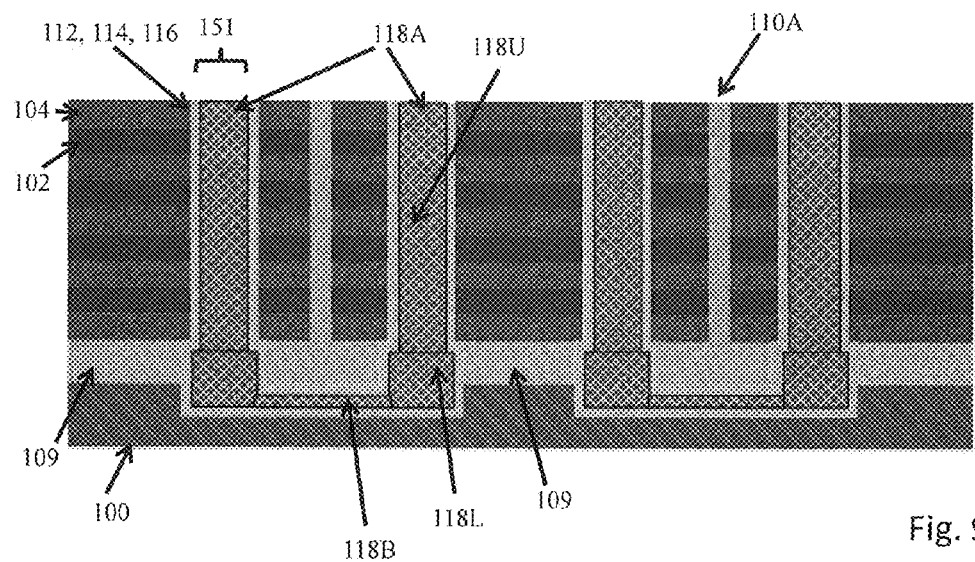
FIG. 9K is a schematic side cross sectional view illustrating a three dimensional memory device according to alternative embodiment.

As shown in FIG. 9K, the memory openings 108 connected by the hollow region 111A formed by removing the sacrificial material 111 may be filled to form respective channel wings 118A and the horizontal channel portion 118B connecting the channel wings 118A of the channel of the vertical three dimensional memory device. The blocking dielectric 112, charge storage material 114 and tunnel dielectric 116 may be formed in the memory openings 108 and hollow region 111A as discussed above with respect to FIGS. 2-4, prior to forming the channel portions 118A, 118B. The resulting semiconductor channel 118 has a U-shaped side cross section which includes two wing portions 118A which extend substantially perpendicular to the major surface of the substrate 100 below the etch stop region 109 and a connecting portion 118B which connects the two wing portions 118A, and which extends substantially parallel to the major surface of the substrate 100 below the etch stop region 109. Additionally, a lower part 118L of each wing portion 118A is wider than an upper part 118U of each wing portion 118A. This is because a width of the memory openings 108 through the stack for first and second layers 102, 104 is narrower than a width of the plurality of memory openings 108 through the etch through regions 109H after the step of etching the stack to form the memory openings 108 and removing the residual etch through material 109H, as shown in FIG. 9J.

The connecting portion 118B of the semiconductor channel 118 is located below the filled slit trench 110A which separates the two wing portions 118A. Further, any of the embodiments illustrated that included filled slit trenches 110A, such as those illustrated in FIGS. 7A-7I, 8 and 9A-9J may be provided with an air gap trench 110. That is, the slit trench 110 may be left unfilled after removing the sacrificial material in the filled trench 110A.

Figure 9L:
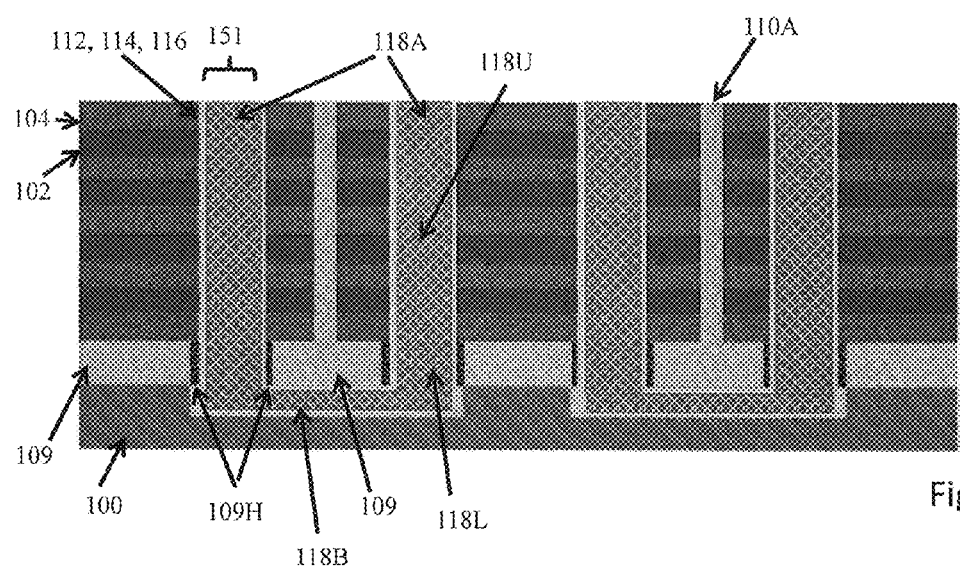
FIG. 9L is a schematic side cross sectional view illustrating another step in the method of making a three dimensional memory device according to an embodiment.

In an alternative embodiment illustrated in FIG. 9L, the remaining etch through material 109H is different from the material of the sacrificial feature 111. Thus, the residual etch through material 109H is not removed when the sacrificial feature 111 is etched out in FIG. 9J. In this embodiment, some of the etch through material remains in the final device as illustrated in FIG. 9L. Furthermore, in this embodiment, the semiconductor channel 118 has a U-shaped side cross section which includes two wing portions 118A which extend substantially perpendicular to the major surface of the substrate 100 through the etch through material regions 109H, and a connecting portion 118B which connects the two wing portions 118A, and which extends substantially parallel to the major surface of the substrate 100 below the etch stop region 109. A lower part 118L of each wing portion 118A located between the substrate 100 and a plurality of control gate electrodes is surrounded by a respective one of the etch through material regions 109H. In other words, each lower part 118L of the cylindrical wing portion 118A is surrounded by the annular regions 109H.

In the embodiments of FIGS. 7, 8 and 9, the step of etching the stack of first and second layers 102, 104 to form the slit trench 110 occurs before the step of etching the stack of first and second layers 102, 104 to form the memory openings 108. The methods may further include steps of filling the slit trench 110 with a sacrificial material to formed a filled slit trench 110A, forming the memory openings 108, removing the sacrificial feature 111 through openings 108 while the slit trench 110 is filled with the sacrificial material and removing the sacrificial material from the slit trench 110 after the step of removing the sacrificial feature 111 to form an air gap slit trench 110 which separates the two wing portions 118A of the channel 118.

Figure 10A:
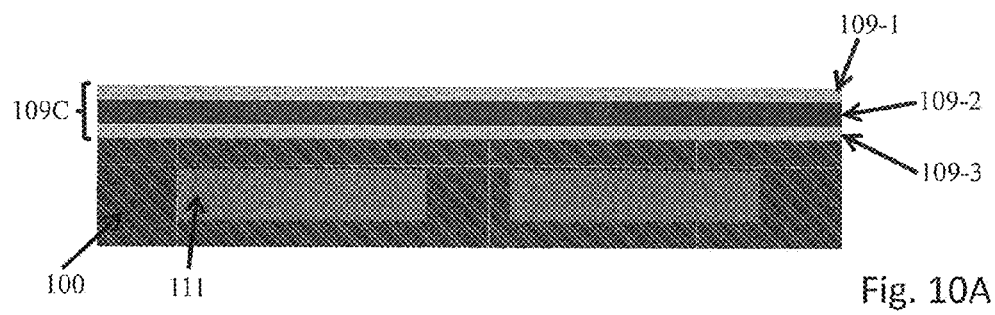
FIG. 10A is a schematic side cross sectional view illustrating a step in a method of making a three dimensional memory device according to another embodiment.

FIGS. 10A-10I illustrate an alternative embodiment of making a three dimensional memory device in which the memory openings 108 are formed before the slit trenches 110. As illustrated in FIG. 10A, a multilayer, composite etch stop 109C is deposited over a substrate 100 which includes regions of sacrificial material 111. In an embodiment, the composite etch stop 109C includes three layers: an upper $SiO_2$ layer 109-1, a middle SiC or Si layer 109-2 and another, lower $SiO_2$ layer 109-3. In alternative embodiments, additional etch stop layers may be provided. Further, other combinations of materials for layers 109-1 to 109-3 may be used. If desired, the composite etch stop 109C may be used in the embodiments illustrated in FIGS. 7-8 and 9.

Figure 10B:
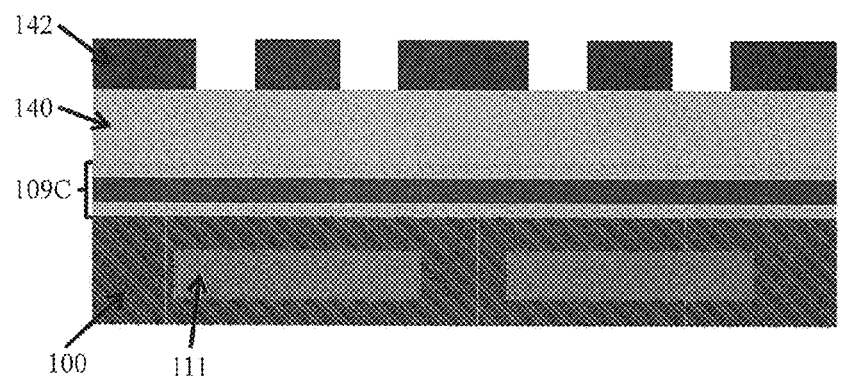
FIG. 10B is a schematic side cross sectional view illustrating another step in the method of making a three dimensional memory device according to the embodiment of FIG. 10A.
Figure 10C:
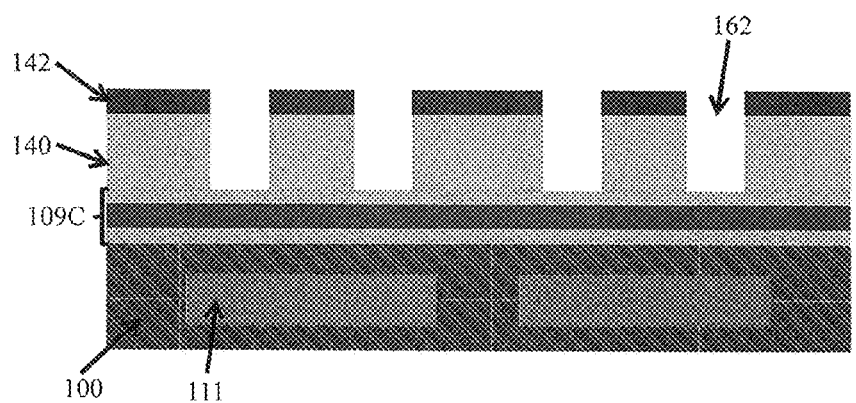
FIG. 10C is a schematic side cross sectional view illustrating another step in the method of making a three dimensional memory device according to the embodiment of FIG. 10A.

As illustrated in FIG. 10B, the composite etch stop 109C is covered with a mask layer 140, such as a hard mask layer. The mask layer 140 may then be covered with a photoresist layer 142. The photoresist layer 142 may then be patterned via photolithography. As illustrated in FIG. 10C, the patterned photoresist layer 142 may be used to pattern the underlying mask layer 140. The mask layer 140 may be patterned by any suitable method, such as RIE.

Figure 10D:
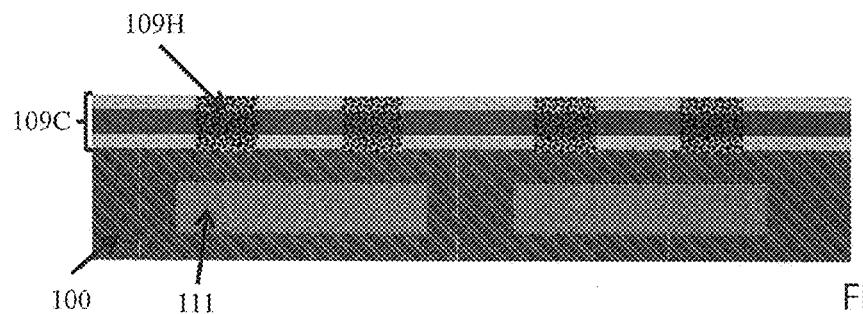
FIG. 10D is a schematic side cross sectional view illustrating another step in the method of making a three dimensional memory device according to the embodiment of FIG. 10A.

As illustrated in FIG. 10D, the patterned mask layer 140 may be used as an implantation mask. That is, exposed regions of the composite etch stop 109C may be doped via ion implantation through the openings 162 in mask 140 to form etch through regions 109H with a higher etch rate than the undoped composite etch stop 109C. After forming the doped regions 109H of the composite etch stop 109C, the photoresist 142 and the mask layer 140 may be removed.

Figure 10E:
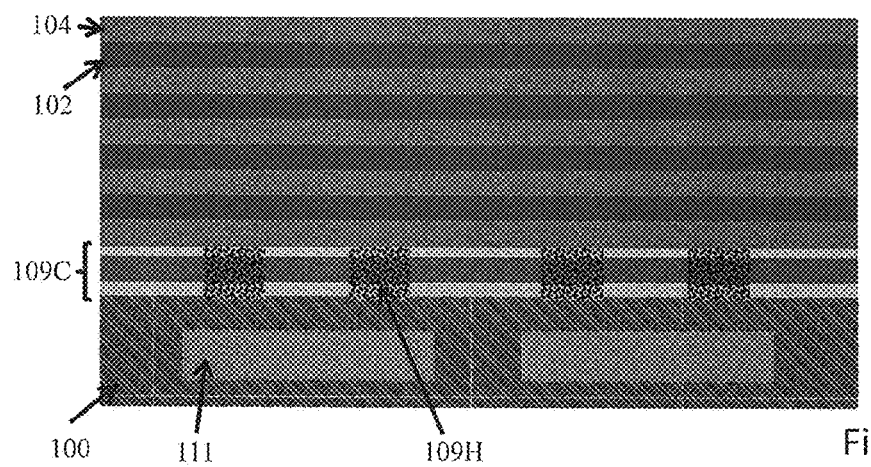
FIG. 10E is a schematic side cross sectional view illustrating another step in the method of making a three dimensional memory device according to the embodiment of FIG. 10A.
Figure 10F:
FIG. 10F is a schematic side cross sectional view illustrating another step in the method of making a three dimensional memory device according to the embodiment of FIG. 10A.
Figure 10G:
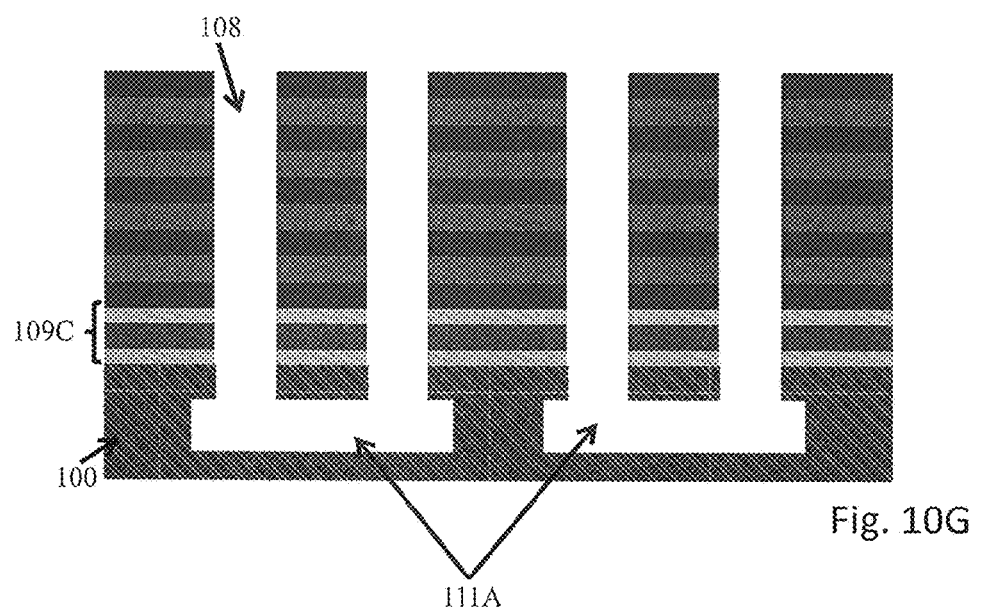
FIG. 10G is a schematic side cross sectional view illustrating another step in the method of making a three dimensional memory device according to the embodiment of FIG. 10A.

After removing the photoresist 142 and the mask layer 140, layers of first and second material 102, 104 may be deposited over the composite etch stop 109C as illustrated in FIG. 10E. As illustrated in FIG. 10F, memory openings 108 may then be etched down to the sacrificial features 111, such as with RIE. The sacrificial feature 111 may then be removed through memory openings 108, such as by selective wet etching as illustrated in FIG. 10G to form a hollow region extending substantially parallel to a major surface of the substrate which connects two memory openings 108 to form a hollow U-shaped pipe space comprising the two memory openings 108 extending substantially perpendicular to the major surface of the substrate connected by the hollow region 111A.

Figure 10H:
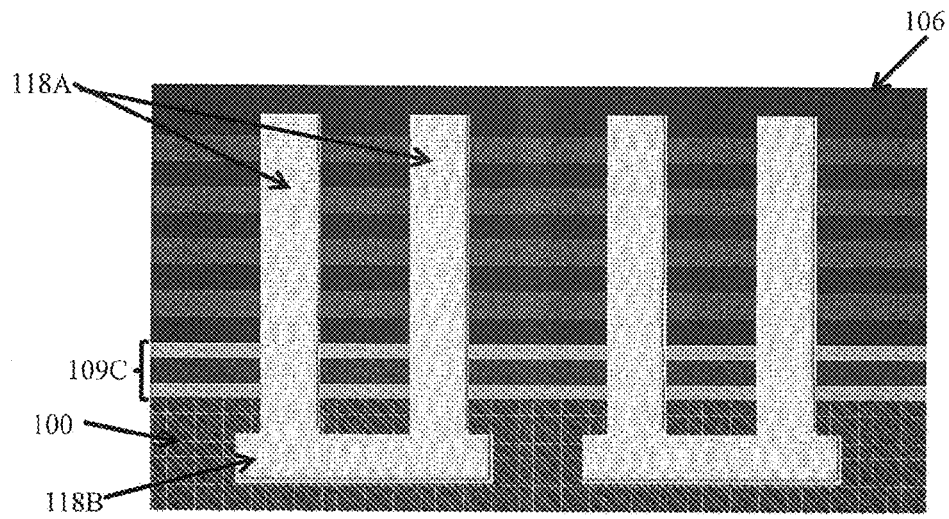
FIG. 10H is a schematic side cross sectional view illustrating another step in the method of making a three dimensional memory device according to the embodiment of FIG. 10A.
Figure 10I:
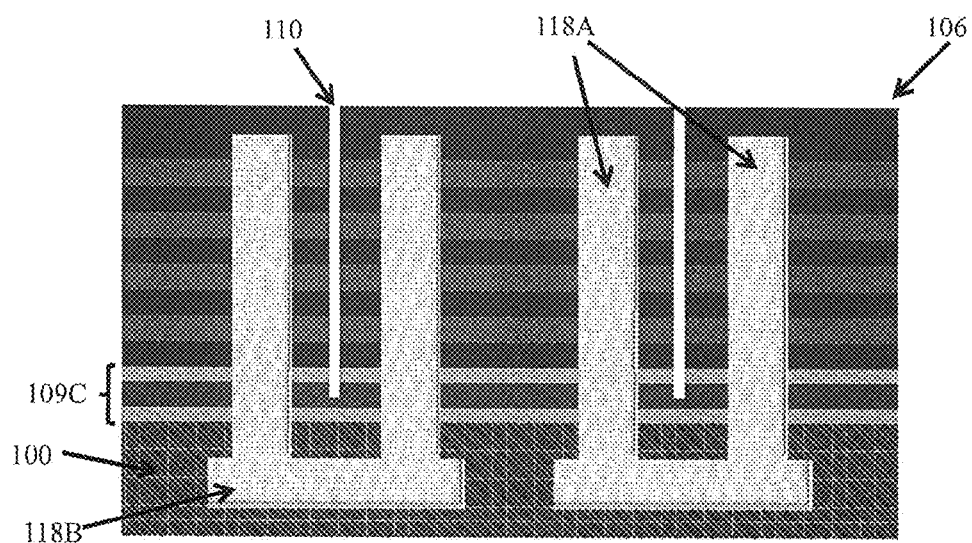
FIG. 10I is a schematic side cross sectional view illustrating another step in the method of making a three dimensional memory device according to the embodiment of FIG. 10A.

As illustrated in FIG. 10H, the memory openings 108 connected by the hollow region 111A formed by removing the sacrificial material 111 may be filled to form respective channel wings 118A and the horizontal channel portion 118B connecting the channel wings 118A of the channel of the vertical three dimensional memory device. The blocking dielectric 112, charge storage material 114 and tunnel dielectric 116 may be formed in the memory openings 108 and hollow region 111A as discussed above with respect to FIGS. 2-4, prior to forming the channel portions 118A, 118B. As illustrated in FIG. 10I the slit trenches 110 may be formed by lithography and RIE through the top insulating layer 106 (e.g. silicon oxide using a TEOS source) and the stack. Thus, in the embodiment of FIGS. 10A-10I, the step of etching the stack of first and second layers 102, 104 to form the slit trench 110 occurs after the step of etching the stack of first and second layers 102, 104 to form the memory openings 108 to form an air gap slit trench 110 which separates the two wing portions 118A.

FIGS. 11-17B illustrate various embodiments of methods of making a modified etch stop layer which may be used to make the three dimensional vertical memory devices discussed above.

Figure 11:
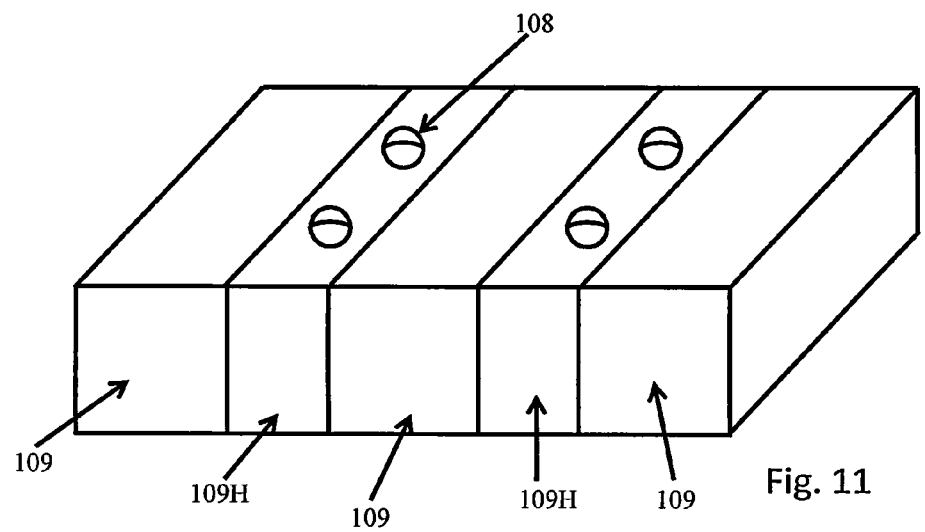
FIG. 11 is a schematic illustration of a modified etch stop layer according to an embodiment.
Figure 13A:
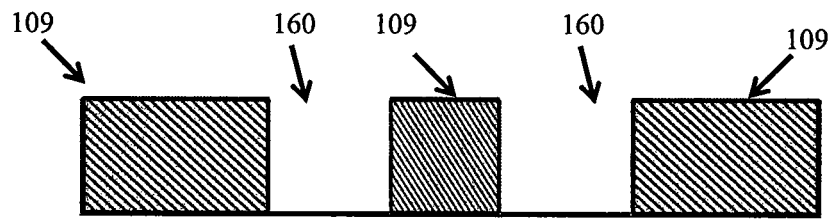
FIGS. 13A and 13B are schematic illustrations of a method of making a modified etch stop layer of FIG. 11.
Figure 13B:
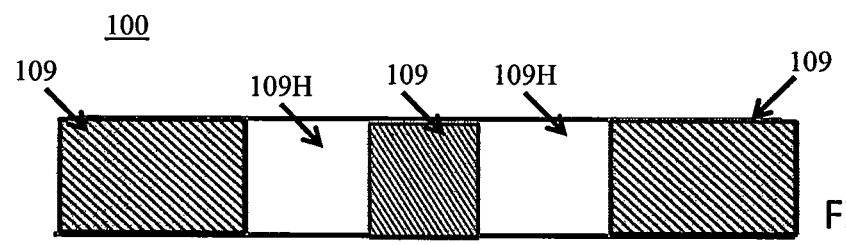

In the embodiment illustrated in FIGS. 11, 13A and 13B, etch through rails 109H are formed in the etch stop layer 109. The etch stop layer 109 is first deposited and then patterned to form rail (e.g. strip) shaped openings 160 in the etch stop layer 109 as shown in FIG. 13A. The rail shaped openings are then filled with the etch through material 109H with a higher etch rate than the etch stop layer 109, as shown in FIG. 13B. Also illustrated in FIG. 11 is the location of the memory openings 108 in the etch through material 109H. Preferably, the memory openings 108 in the etch through regions 109H of the etch stop layer 109 are formed in the same step as forming the memory openings 108 in the stack of the first 102 and second 104 layers, thereby forming self-aligned memory openings 108.

In the embodiments of FIGS. 7A-8, 11 and 13, the etch stop region 109 comprises an etch stop layer comprising the etch stop material, and the plurality of etch through regions 109H comprise substantially cylindrical or substantially rail shaped regions of the etch through material embedded in the etch stop layer. Forming the etch through regions and the etch stop region comprises forming the etch stop layer 109 of the etch stop material over the sacrificial feature 111, forming a plurality of substantially cylindrical or substantially rail shaped trenches 160 in the etch stop layer which expose the sacrificial feature 111, and filling the trenches with a plurality of substantially cylindrical or substantially rail shaped regions of the etch through material 109H.

Figure 12:
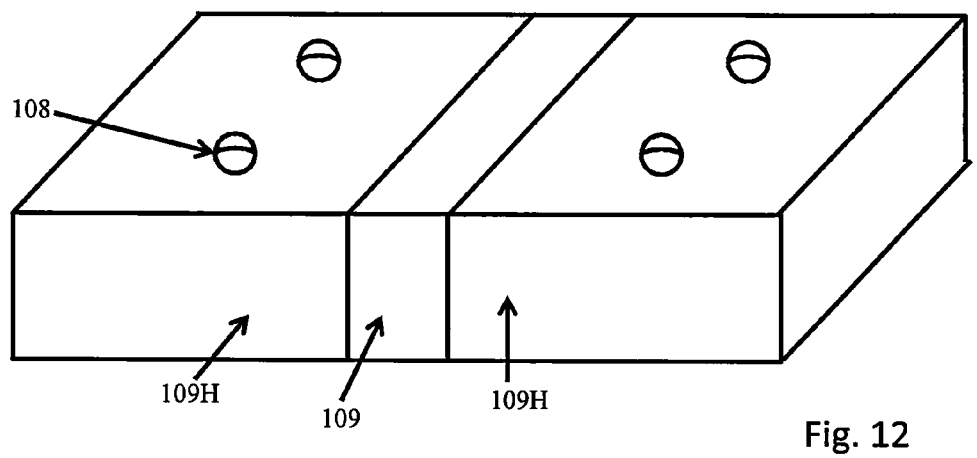
FIG. 12 is a schematic illustration of a modified etch stop layer according to another embodiment.
Figure 14A:
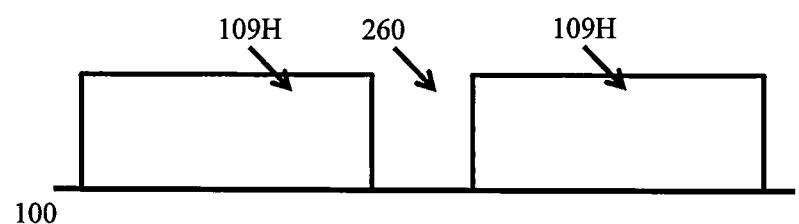
FIGS. 14A and 14B are schematic illustrations of a method of making a modified etch stop layer of FIG. 12.
Figure 14B:
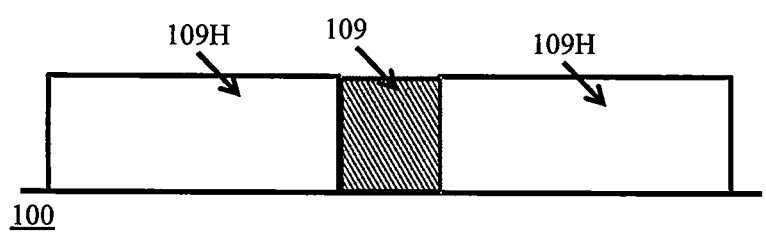

FIGS. 12, 14A and 14B illustrate an alternative embodiment in which etch stop rails 109 are formed in an etch through layer 109H, (i.e., the etch through regions 109H comprise a plurality of portions of a layer of the etch through material and the etch stop region 109 comprises a substantially rail shaped region of the etch stop material embedded between the portions 109H of the layer of the etch through material). For example, a layer of etch through material 109H is first deposited on a substrate 100 and then patterned to form rail (strip) shaped openings 260 as shown in FIG. 14A. Etch stop material 109 may then be deposited in the rail shaped openings 260. FIG. 12 illustrates the location of the memory openings 108 in the etch through material 109H, as shown in FIG. 14B. As in the previous embodiment, the memory openings 108 in the etch through regions 109H may be formed in the same step as etching the stack of first and second layers 102, 104. Thus, forming the plurality of etch through regions and the etch stop region includes forming the layer of the etch through material over the sacrificial feature 111, forming a substantially rail shaped trench 260 in the layer of the etch through material 109H, and filling the trench 260 with a substantially rail shaped region of the etch stop material 109.

Figure 15A:
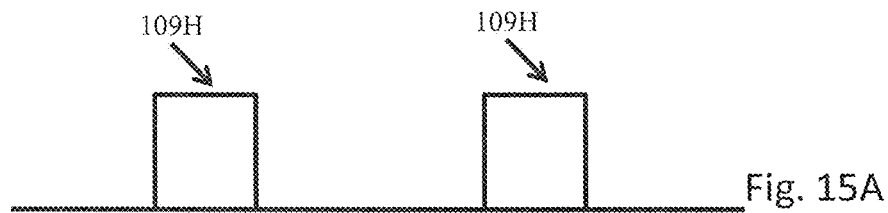
FIGS. 15A and 15B are schematic illustrations of a method of making a modified etch stop layer according to another embodiment.
Figure 15B:
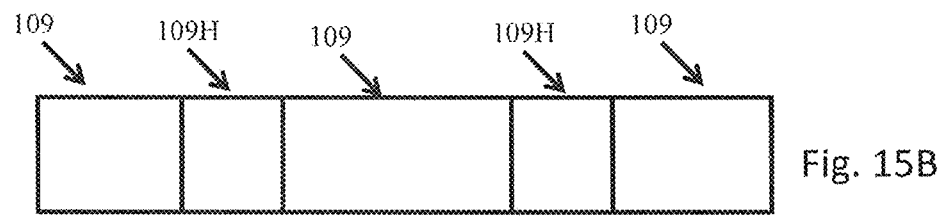

FIGS. 15A and 15B illustrate another method of forming a modified etch stop in which the etch through strips 109H are formed before the etch stop layer 109. In this embodiment, a layer of etch through material is first deposited on a substrate 100 and then patterned into rails 109H. In contrast to the previous embodiment, the etch through material is patterned into thin strip shaped rails 109H rather than forming openings in the etch through layer. Then, etch stop material 109 is deposited between the rails of etch through material 109H. Thus, this method includes forming a plurality of substantially rail (or alternatively the substantially cylindrical) shaped regions 109H of the etch through material over the sacrificial feature 111, and forming the etch stop layer 109 of the etch stop material between the substantially cylindrical or substantially rail shaped regions 109H. Thus, the method of FIGS. 15A and 15B results in a structure that is similar to that shown in FIG. 11, but using the different method steps from those shown in FIGS. 13A and 13B.

In another embodiment, the etch stop material 109 may be formed before the etch through layer 109H. Thus, this method includes forming a substantially rail shaped region 109 of the etch stop material over the sacrificial feature 111 and forming the layer of the etch through material around the substantially rail shaped region 109. Thus, this method results in a structure that is similar to that shown in FIG. 12, but using the different method steps from those shown in FIGS. 14A and 14B.

Figure 16A:
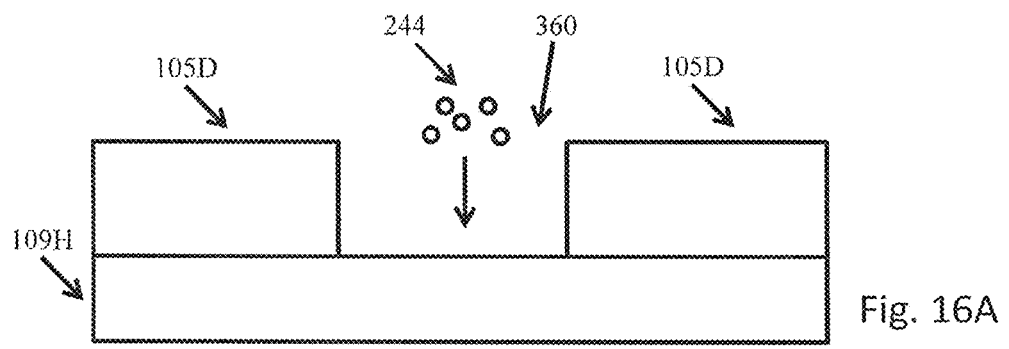
FIGS. 16A and 16B are schematic illustrations of a method of making a modified etch stop layer according to another embodiment.
Figure 16B:
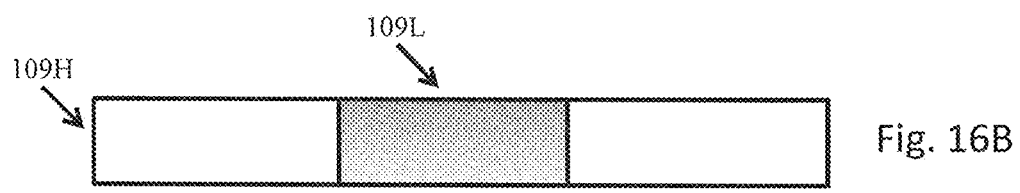

In the alternative embodiment illustrated in FIGS. 16A and 16B, a mask 105D, such as a hard mask is deposited on the layer of etch through material 109H. The mask 105D is then patterned to expose portions of the etch through layer 109H in the opening 360. The exposed portion of etch through layer 109H in the opening 360 is then ion implanted, such as with Ga ions 244 to form implanted regions 109L. In this embodiment, the implanted ions form the implanted etch stop material regions 109L to have a lower etch rate than the non-implanted portions 109H of the etch through layer. Thus, in this embodiment, forming the etch through regions 109H and the etch stop region 109 includes forming the layer of the etch through material over the sacrificial feature 111, forming mask 105D over the layer of the etch through material such that a substantially rail shaped region 109L in the layer is exposed through the mask 105D, and ion implanting the exposed substantially rail shaped region 109L in the layer of the etch through material to convert the etch through material to the etch stop material in the substantially rail shaped region 109L.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a semiconductor device, comprising:
   forming a sacrificial feature over a substrate;
   forming a plurality of etch through regions comprising an etch through material and an etch stop region comprising an etch stop material over the sacrificial feature;
   forming a stack of alternating layers of a first material and a second material over the plurality of etch through regions and the etch stop region;
   etching the stack to form a plurality of openings through the stack and through the etch through regions to expose the sacrificial feature, such that the etch through material is etched preferentially compared to the first and the second materials of the stack;
   removing the sacrificial feature through the plurality of openings;
   and etching the stack to form a slit trench up to or only partially through the etch stop region, such that the first and the second materials of the stack are etched preferentially compared to the etch stop material,
   wherein:
   the plurality of etch through regions comprise a plurality of portions of a layer of the etch through material and the etch stop region comprises a substantially rail shaped region of the etch stop material embedded between the portions of the layer oft he etch through material; and
   forming the plurality of etch through regions and the etch stop region comprises one of:
   (a) forming a substantially rail shaped region of the etch stop material over the sacrificial feature, and forming the layer of the etch through material around the substantially rail shaped region;
   (b) forming the layer of the etch through material over the sacrificial feature, forming a substantially rail shaped trench in the layer of the etch through material, and filling the trench with a substantially rail shaped region of the etch stop material; and
   (c) forming the layer of the etch through material over the sacrificial feature, forming mask over the layer of the etch through material such that a substantially rail shaped region in the layer is exposed in the mask, and on implanting the exposed substantially rail shaped region in the layer of the etch through material to convert the etch through material to the etch stop material in the substantially rail shaped region.

2. The method of claim 1, further comprising:
forming a blocking dielectric in the plurality of openings;
forming a charge storage layer over the blocking dielectric;
forming a tunnel dielectric over the charge storage layer; and
forming a semiconductor channel over the tunnel dielectric.

3. The method of claim 2, wherein:
the semiconductor device comprises a monolithic, three dimensional vertical NAND string;
the plurality of openings comprise two memory openings extending to the same sacrificial feature; and
the slit trench is located between the two memory openings.

4. The method of claim 3, wherein the step of removing the sacrificial feature through the two memory openings forms a hollow region extending substantially parallel to a major surface of the substrate which connects the two memory openings to form a hollow U-shaped pipe space comprising the two memory openings extending substantially perpendicular to the major surface of the substrate connected by the hollow region.

5. The method of claim 4, wherein forming the semiconductor channel comprises forming the semiconductor channel in the hollow U-shaped pipe space such that the semiconductor channel has a U-shaped side cross section, comprising:
two wing portions which extend substantially perpendicular to the major surface of the substrate above the etch stop region;
a connecting portion which extends substantially parallel to the major surface of the substrate below the etch stop region and which connects the two wing portions; and
the semiconductor channel has a cross section of two circles when viewed from above.

6. The method of claim 5, wherein:
the etch through material is etched at a higher rate compared to the first and the second materials of the stack during the step of etching the stack to form the plurality of openings;
the first and the second materials of the stack are etched at a higher rate compared to the etch stop material during the step of etching the stack to form the slit trench;
the plurality of etch through regions and the etch stop region are located in a same horizontal plane above both the major surface of the substrate and the sacrificial feature, but below the stack;
the etch through material in the plurality of etch through regions and the etch stop material in the etch stop region form a substantially planar upper surface over which the stack is formed;
the first material comprises a conductive or semiconductor control gate material; and
the second material comprises an insulating material.

7. The method of claim 6, wherein:
a source electrode contacts the first wing;
drain electrode contacts the second wing;
the etch stop material comprises aluminum oxide, aluminum nitride, aluminum oxynitride, hafnium oxide, tantalum oxide, boron nitride or boron carbide or combinations thereof;
the etch through material comprises silicon germanium, amorphous silicon, amorphous carbon, silicon carbide, germanium, tungsten or tungsten silicide or combinations thereof;
the first material comprises polysilicon;
the second material comprises silicon oxide, silicon nitride or silicon oxynitride; and
the sacrificial feature comprises amorphous carbon, amorphous silicon or silicon nitride.

8. The method of claim 7, wherein the step of etching the stack to form the slit trench occurs after the step of etching the stack to form the plurality of openings to form an air gap slit trench which separates the two wing portions.

9. The method of claim 7, wherein the step of etching the stack to form the slit trench occurs before the step of etching the stack to form the plurality of openings, and further comprising:
filling the slit trench with a sacrificial material;
removing the sacrificial feature while the slit trench is filled with the sacrificial material; and
removing the sacrificial material from the slit trench after the step of removing the sacrificial feature to form an air gap slit trench which separates the two wing portions.

10. The method of claim 1, wherein:
etching the stack to form the plurality of openings comprises reactively ion etching the plurality of openings through the stack and through the etch through material in the plurality of etch through regions using a first mask;
removing the sacrificial feature comprises selectively wet etching the sacrificial feature through the plurality of openings; and
etching the stack to form the slit trench comprises reactively ion etching the slit trench through the stack using a second mask different from the first mask.

11. The method of claim 1, wherein:
etching the stack to form the plurality of openings comprises reactively ion etching the plurality of openings through the stack up to or only partially through the etch through material in the plurality of etch through regions using a first mask;
removing the sacrificial feature comprises selectively wet etching both the sacrificial feature and the etch through material via the plurality of openings in a same selective wet etching step;
sacrificial feature and the etch through material comprise the same material or a different material from each other; and
etching the stack to form the slit trench comprises reactively ion etching the slit trench through the stack using a second mask different from the first mask.

12. The method of claim 1, wherein a width of the plurality of openings through the stack is narrower than a width of the plurality of openings through the etch through regions after the step of etching the stack to form the plurality of openings.

13. The method of claim 1, wherein:
the etch through material comprises a refractory metal, a refractory metal nitride or a refractory metal silicide;
the refractory metal has a higher atomic weight than elements of the Periodic Table making up the first and the second materials of the stack;
etching the stack to form the plurality of openings comprises reactive ion etching the stack; and
during the reactive ion etching, ions of the refractory metal impinge on a sidewall of the plurality of openings to at least widen a diameter of a lower portion of the openings in the stack or to remove stringer residue on the sidewall of the plurality of the openings.

14. The method of claim 1, wherein forming the plurality of etch through regions and the etch stop region comprises forming the substantially rail shaped region of the etch stop material over the sacrificial feature, and forming the layer of the etch through material around the substantially rail shaped region.

15. The method of claim 1, wherein forming the plurality of etch through regions and the etch stop region comprises forming the layer of the etch through material over the sacrificial feature, forming a substantially rail shaped trench in the layer of the etch through material, and filling the trench with a substantially rail shaped region of the etch stop material.

16. The method of claim 1, wherein forming the plurality of etch through regions and the etch stop region comprises forming the layer of the etch through material over the sacrificial feature, forming mask over the layer of the etch through material such that the substantially rail shaped region in the layer is exposed in the mask, and ion implanting the exposed substantially rail shaped region in the layer of the etch through material to convert the etch through material to the etch stop material in the substantially rail shaped region.

\* \* \* \* \*